United States Patent
Hellberg

(10) Patent No.: US 9,941,851 B2
(45) Date of Patent: Apr. 10, 2018

(54) AMPLIFIER CIRCUIT AND METHOD

(71) Applicant: Telefonaktiebolaget LM Ericsson (publ), Stockholm (SE)

(72) Inventor: Richard Hellberg, Huddinge (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 0 days.

(21) Appl. No.: 15/126,653

(22) PCT Filed: Mar. 19, 2014

(86) PCT No.: PCT/EP2014/055525
§ 371 (c)(1),
(2) Date: Sep. 16, 2016

(87) PCT Pub. No.: WO2015/139745
PCT Pub. Date: Sep. 24, 2015

(65) Prior Publication Data
US 2017/0093352 A1    Mar. 30, 2017

(51) Int. Cl.
*H03F 3/68* (2006.01)
*H03F 3/60* (2006.01)
(Continued)

(52) U.S. Cl.
CPC .......... *H03F 3/602* (2013.01); *H03F 1/0288* (2013.01); *H03F 3/19* (2013.01);
(Continued)

(58) Field of Classification Search
CPC . H03F 3/60; H03F 3/602; H03F 3/605; H03F 3/68; H03F 1/0288
(Continued)

(56) References Cited

U.S. PATENT DOCUMENTS

| 8,022,760 B2 | 9/2011 | Gajadharsing et al. |
| 2006/0044060 A1 | 3/2006 | Shiikuma |

(Continued)

FOREIGN PATENT DOCUMENTS

| EP | 2403135 A1 | 1/2012 |
| WO | 2014206501 A1 | 12/2014 |
| WO | 2014206502 A1 | 12/2014 |

OTHER PUBLICATIONS

Doherty, W. H., "A New High Efficiency Power Amplifier for Modulated Waves", Proceedings of the Institute of Radio Engineers, vol. 24, No. 9, Sep. 1936, pp. 1163-1182.

(Continued)

*Primary Examiner* — Steven J Mottola
(74) *Attorney, Agent, or Firm* — Murphy, Bilak & Homiller, PLLC

(57) ABSTRACT

An amplifier arrangement comprises N amplifier stages $10_1$ to $10_N$, wherein N is an integer equal or greater than five. The amplifier arrangement comprises a cascade of quarter wavelength transmission line segments $11_1$ to $11_M$ coupled between an output of an amplifier of a first amplifier stage and an output node 15 of the amplifier arrangement. At least one intermediate junction 12 in the cascade of quarter wavelength transmission line segments comprises: a first amplifier coupled directly to the intermediate junction 12; and a second amplifier coupled to the same intermediate junction 12 via a connecting quarter wavelength trans mission line $13_1$.

20 Claims, 44 Drawing Sheets

(51) Int. Cl.
*H03F 1/02* (2006.01)
*H03F 3/19* (2006.01)

(52) U.S. Cl.
CPC .. *H03F 2200/255* (2013.01); *H03F 2200/405* (2013.01); *H03F 2200/451* (2013.01)

(58) Field of Classification Search
USPC .............................. 330/54, 124 R, 286, 295
See application file for complete search history.

(56) References Cited

U.S. PATENT DOCUMENTS

| | | |
|---|---|---|
| 2006/0087376 A1* | 4/2006 | Young ................ H03F 1/523 330/286 |
| 2006/0114060 A1 | 6/2006 | Hellberg et al. |
| 2011/0175677 A1 | 7/2011 | Jeong et al. |
| 2011/0254628 A1 | 10/2011 | Hellberg |
| 2013/0154731 A1 | 6/2013 | Gajadharsing |

OTHER PUBLICATIONS

Raab, Frederick H, "Efficiency of Doherty RF Power-Amplifier Systems", IEEE Transactions on Broadcasting, vol. BC-33, No. 3, Sep. 1987, 77-8.

* cited by examiner

Output amplitude

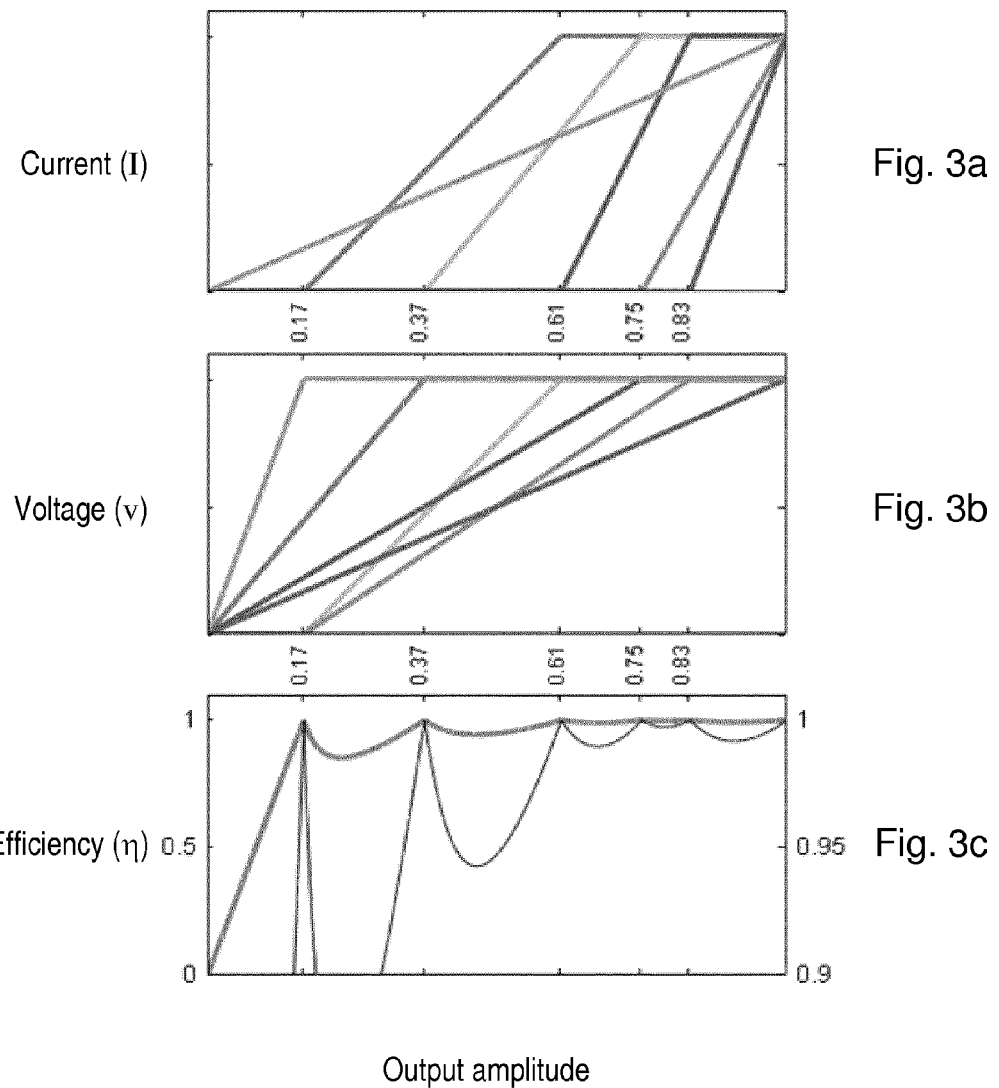

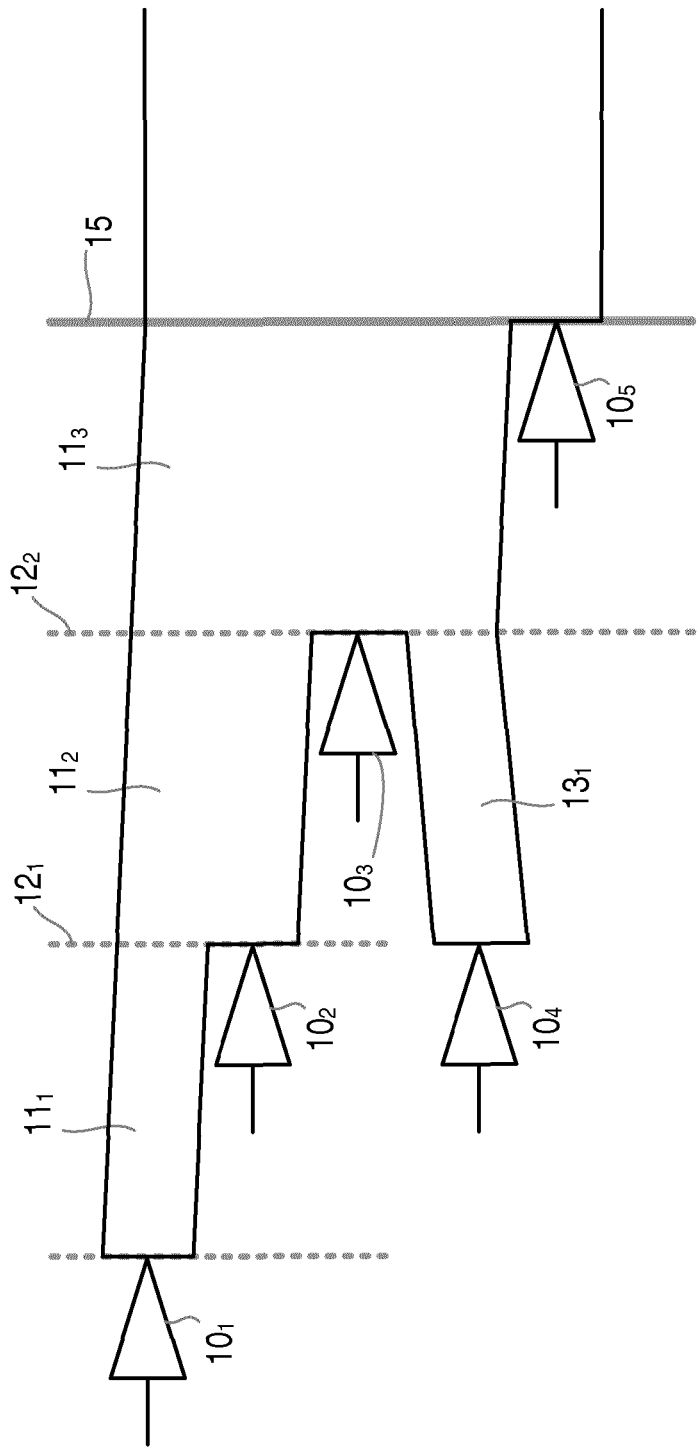

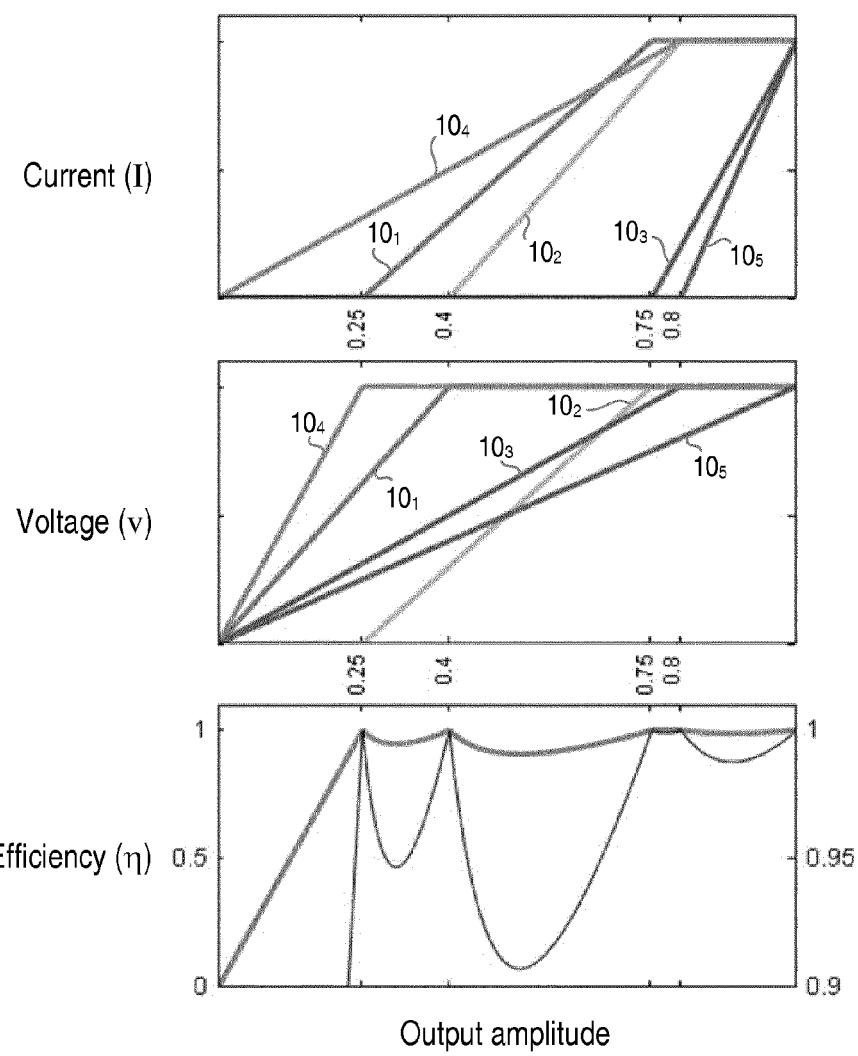

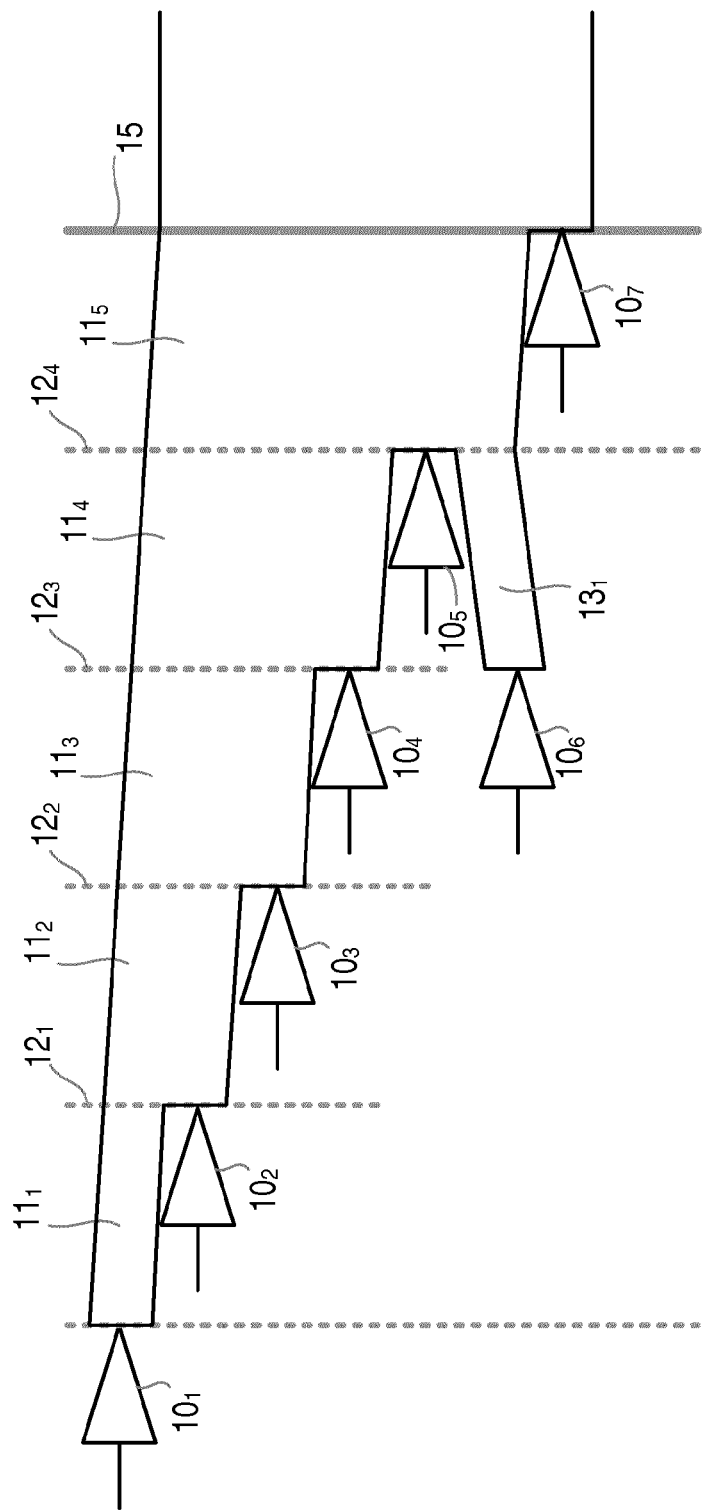

Output amplitude

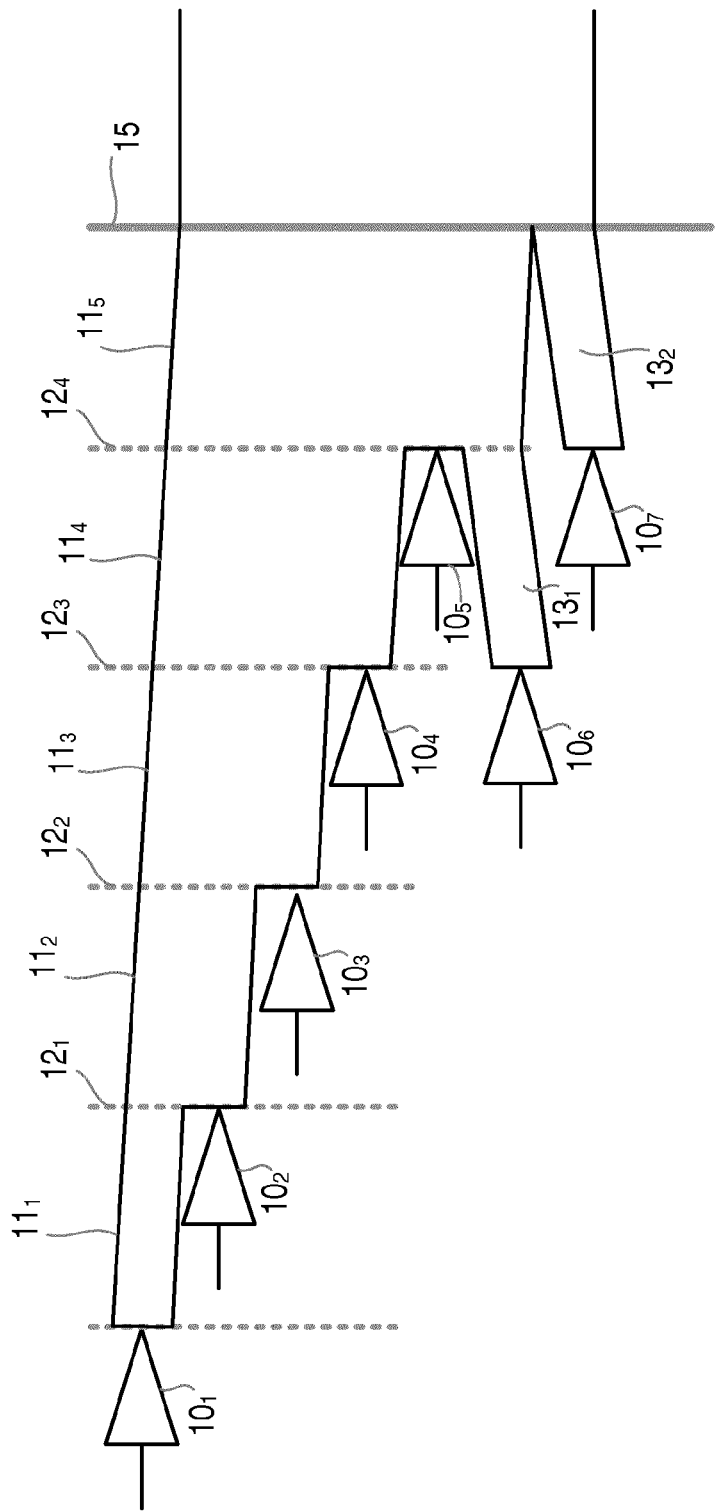

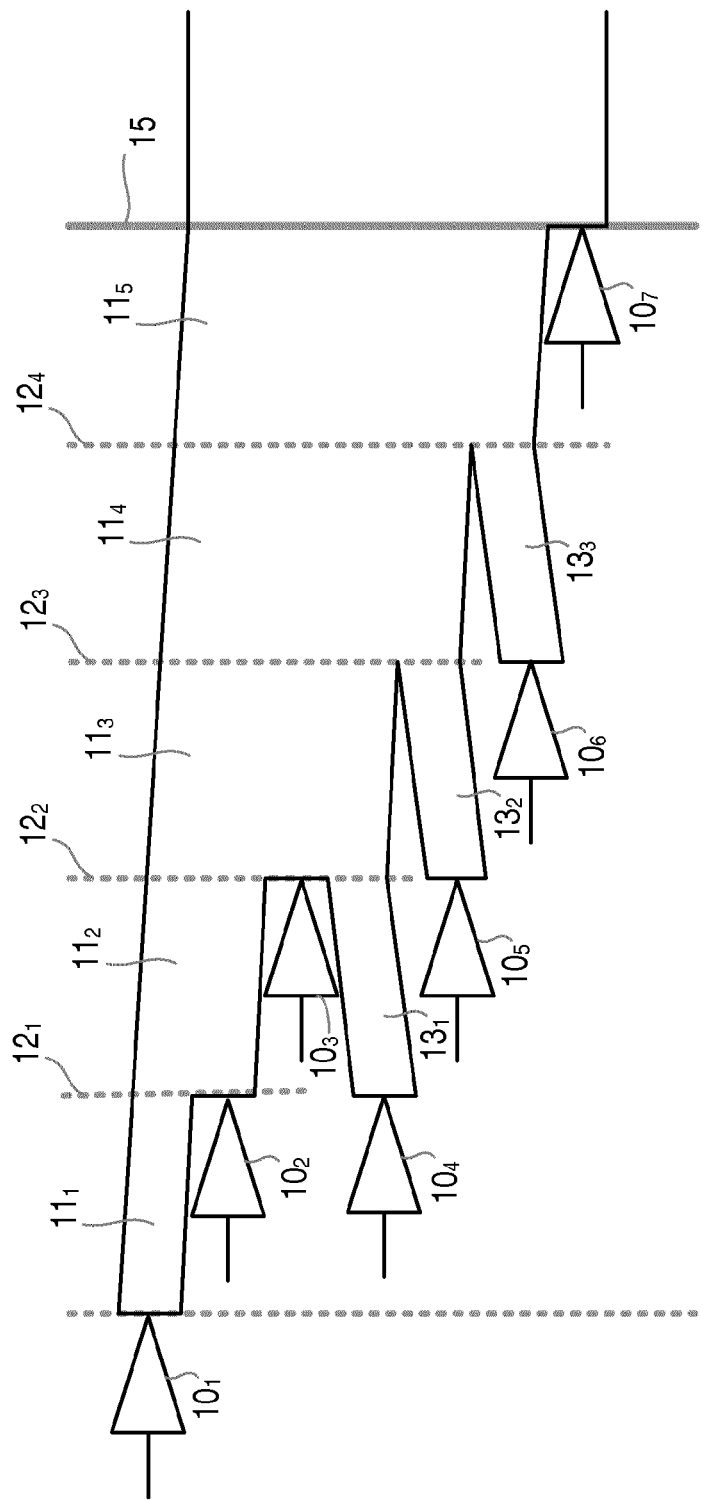

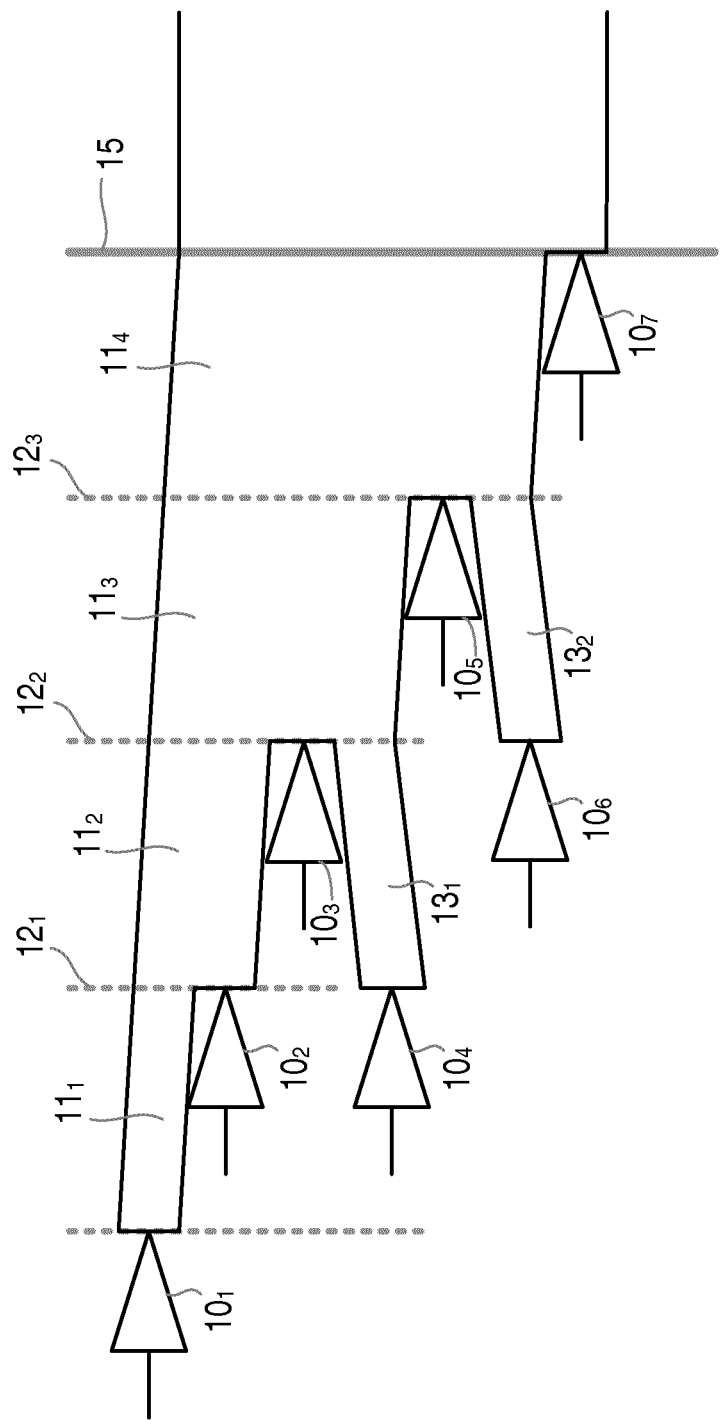

AMPLIFIER CIRCUIT AND METHOD

TECHNICAL FIELD

The present invention relates generally to an amplifier circuit and method, and more particularly to an amplifier circuit and method which provides improved efficiency, for example an amplifier circuit comprising at least first and second amplifiers configured to operate in a Doherty mode of operation.

BACKGROUND

Power amplifiers in wideband radio systems are often used to amplify wideband signals or signal combinations with high peak to average power ratio, PAR. The amplifiers must then be able to repeatedly output very high power for very short periods, even though the bulk of the output power is generated at the much lower average power level. In systems with random phase combinations of many signals (without any dominating ones) the amplitude of the signal follows a Rayleigh distribution.

A conventional single-transistor power amplifier (for example a class B, AB or F power amplifier) has a fixed radio frequency (RF) load resistance and a fixed voltage supply. The bias in class B or AB amplifiers causes the output current to have a form close to that of a pulse train of half wave rectified sinusoid current pulses. The direct current (DC) current (and hence DC power) is therefore largely proportional to the RF output current amplitude (and voltage). The output power, however, is proportional to the RF output current squared. The efficiency, i.e. output power divided by DC power, is therefore also proportional to the output amplitude. The average efficiency of a power amplifier is consequently low when amplifying signals that on average have a low output amplitude (or power) compared to the maximum required output amplitude (or power), i.e. high PAR.

An example of a Doherty amplifier is described in "A new high efficiency power amplifier for modulated waves,", W. H. Doherty, Proc. IRE, vol. 24, no. 9, pp. 1163-1182, September 1936. Doherty amplifiers such as this have high average efficiency for amplitude-modulated signals with high peak-to-average ratio (PAR) since they have a much lower average sum of RF output current magnitudes from the transistors at low amplitudes. This causes high average efficiency since the DC currents drawn by the transistors are largely proportional to the RF current magnitudes.

Reduced RF output currents are obtained by having high transimpedance from at least one transistor to the output, while having the possibility of in-phase combining all transistor outputs to obtain full output power. Higher transimpedance means higher voltage at the output for the same amount of current. This is achieved in the Doherty amplifier by having the main transistor ("carrier amplifier") displaced from the output node by a quarter wavelength transmission line of characteristic impedance Ropt, (where a transistor's Ropt is the optimal load resistance for achieving maximum output power).

Since the load Rload has a lower value than Ropt (typically Rload=Ropt/2) this line acts as a quarterwave transformer. The transimpedance to the output from the main transistor is equal to the characteristic impedance of the quarterwave line (i.e. Ropt), instead of Rload as would be the case for one transistor coupled directly to the load. The self-impedance at the main transistor is increased quadratically to the characteristic impedance squared divided by Rload (aka "impedance inversion" of the load). If the peak transistor (also known as "auxiliary amplifier" or "peaking amplifier") has an Ropt that in parallel combination with the Ropt of the main transistor gives Rload, full combined output power will be possible by in-phase combining (i.e. adjusting the phase (time, electrical length) difference between the main and peak drive signals so the output waves from both are in phase at the output Rload).

The carrier amplifier output current is linear in amplitude, i.e. follows the desired output signal. The peaking amplifier output current is zero for low amplitudes, and rises (piecewise) linearly from the transition point. The transition point for a 2-stage Doherty designed for two equal size transistors is at half the maximum output amplitude. The shaping of the output RF current amplitude is in some cases done by biasing the gate low and increasing the RF drive voltage, known as class C operation. This shaping can also be done, wholly or partially, earlier in the processing chain, by analog or digital signal shaping circuits.

A first way to extend the Doherty amplifier to more stages (transistors, constituent amplifiers) was shown by F. H. Raab in a paper entitled "Efficiency of Doherty RF Power Amplifier Systems", IEEE Trans. Broadcasting, vol. BC-33, no. 3, pp. 77-83, September 1987. These amplifiers can be described as having a cascade of quarterwave transmission lines with successively lower characteristic impedance towards the output (load), where RF transistors are connected at the junctions between the transmission lines. The resulting amplifier makes it possible to have high efficiency in a wider range of back off.

U.S. Pat. No. 8,022,760 discloses an alternative arrangement for 3-transistor Doherty amplifiers, whose main benefit is better placement of the transition points (corresponding to high points in the efficiency vs. amplitude curve) for equal-sized transistors. Higher order versions of the 3-transistor Doherty amplifier in U.S. Pat. No. 8,022,760 consist of having a higher order quarterwave cascade multistage Doherty as a peaking amplifier. Only the ones with an odd total number, N, of transistors (5, 7, 9 etc . . . ) work, i.e. those that have quarterwave cascades with an even number, N-1, of quarterwave lines.

EP2,403,135 discloses a four-transistor Doherty amplifier. This is basically the 3-stage amplifier of U.S. Pat. No. 8,022,760 with an added peaking amplifier at the output node and has largely the same advantages as U.S. Pat. No. 8,022,760 regarding transistor sizes. Higher order versions of EP2,403,135 consist of even numbers, N, of transistors, with both a directly connected and a quarterwave-connected transistor at the output node. The quarterwave cascade in the peaking amplifier branch will therefore have the total length, N-2, i.e. the same lengths as for the amplifiers in U.S. Pat. No. 8,022,760.

The multistage Doherty amplifiers by Raab generally have their transition points too high to give good average efficiency with high-PAR signals if the transistor stages are of equal size. FIGS. 1a, 1b and 1c show the curves for a 4-stage implementation, in which the lowest transition point is at 0.37 of full output. The amplifiers with higher numbers of stages generally have the same problem, as do arrangements in which a small number of different transistor sizes are available.

The requirement for several different amplitude-limited drive signals can pose a problem in some implementation technologies, for example increased implementation complexity.

Referring to FIGS. 2a to 2c, the 5-stage amplifier according to U.S. Pat. No. 8,022,760 has advantages over those of Raab for use with high-PAR signals, since the lowest transition point with five equal sized transistors is at 0.2 of full output amplitude (−14 dB). However, it has a sparse distribution of transition points at low amplitude.

For six and higher numbers of stages, implementations with equal size transistors of U.S. Pat. No. 8,022,760 and EP2,403,135 all suffer from too sparse transition points at low output amplitudes, as illustrated by FIGS. 3a to 3c for a 6-stage arrangement according to EP2,403,135 and FIGS. 4a to 4c for a 7-stage amplifier according to U.S. Pat. No. 8,022,760.

Thus, each of the amplifier arrangements described in FIGS. 2, 3 and 4 have the disadvantage of requiring several amplitude limited drive signals, and also have the disadvantage of having a poor distribution of transition points.

SUMMARY

It is an aim of the present invention to provide a method and apparatus which obviate or reduce at least one or more of the disadvantages mentioned above.

According to a first aspect of the present invention there is provided an amplifier arrangement comprising N amplifier stages, wherein N is an integer equal or greater than five. The amplifier arrangement comprises a cascade of quarter wavelength transmission line segments coupled between an output of an amplifier of a first amplifier stage and an output node of the amplifier arrangement. At least one intermediate junction in the cascade of quarter wavelength transmission line segments comprises a first amplifier coupled directly to the intermediate junction, and a second amplifier coupled to the same intermediate junction via a connecting quarter wavelength transmission line.

In this manner the same junction (i.e. the at least one intermediate node) has one amplifier connected directly thereto, and another connected via a connecting quarter wavelength transmission line. This has the advantage of giving rise to new current, voltage an efficiency curve behaviours compared to prior multistage Doherty amplifiers, and provides additional ways of achieving desired efficiency curves when only a limited set of transistor sizes (or only one size) is available.

According to another aspect of the present invention there is provided a method of improving the efficiency of an amplifier arrangement comprising N amplifier stages, wherein N is an integer equal or greater than five, and wherein the amplifier arrangement comprises a cascade of quarter wavelength transmission line segments coupled between an output of an amplifier of a first amplifier stage and an output node of the amplifier arrangement. The method comprises the steps of coupling a first amplifier directly to an intermediate junction of the cascade of quarter wavelength transmission lines, and coupling a second amplifier to the same intermediate junction via a connecting quarter wavelength transmission line.

BRIEF DESCRIPTION OF THE DRAWINGS

For a better understanding of examples of the present invention, and to show more clearly how the examples may be carried into effect, reference will now be made, by way of example only, to the following drawings in which:

FIGS. 3a to 3c show current, voltage and efficiency curves for a known amplifier arrangement;

FIG. 5a shows an amplifier arrangement according to an embodiment of the present invention;

FIGS. 5b to 5d show current, voltage and efficiency curves for the amplifier arrangement of FIG. 5a;

FIGS. 6b to 6d show current, voltage and efficiency curves for the amplifier arrangement of FIG. 6a;

FIGS. 7b to 7d show current, voltage and efficiency curves for the amplifier arrangement of FIG. 7a;

FIGS. 8b to 8d show current, voltage and efficiency curves for the amplifier arrangement of FIG. 8a;

FIGS. 9b to 9d show current, voltage and efficiency curves for the amplifier arrangement of FIG. 9a;

FIG. 10a shows an amplifier arrangement according to another embodiment of the present invention;

FIGS. 10b to 10d show current, voltage and efficiency curves for the amplifier arrangement of FIG. 10a;

FIGS. 11b to 11d show current, voltage and efficiency curves for the amplifier arrangement of FIG. 11a;

FIGS. 12b to 12d show current, voltage and efficiency curves for the amplifier arrangement of FIG. 12a;

FIG. 13a shows an amplifier arrangement according to another embodiment of the present invention;

FIGS. 13b to 13d show current, voltage and efficiency curves for the amplifier arrangement of FIG. 13a;

FIGS. 14b to 14d show current, voltage and efficiency curves for the amplifier arrangement of FIG. 14a;

FIGS. 15b to 15d show current, voltage and efficiency curves for the amplifier arrangement of FIG. 15a;

FIG. 16a shows an amplifier arrangement according to another embodiment of the present invention;

FIGS. 16b to 16d show current, voltage and efficiency curves for the amplifier arrangement of FIG. 16a;

FIGS. 17b to 17d show current, voltage and efficiency curves for the amplifier arrangement of FIG. 17a;

FIG. 18a shows an amplifier arrangement according to another embodiment of the present invention;

FIGS. 18b to 18d show current, voltage and efficiency curves for the amplifier arrangement of FIG. 18a;

FIGS. 19b to 19d show current, voltage and efficiency curves for the amplifier arrangement of FIG. 19a;

FIGS. 20b to 20d show current, voltage and efficiency curves for the amplifier arrangement of FIG. 20a;

FIGS. 21b to 21d show current, voltage and efficiency curves for the amplifier arrangement of FIG. 21a;

FIGS. 22b to 22d show current, voltage and efficiency curves for the amplifier arrangement of FIG. 22a;

FIGS. 23b to 23d show current, voltage and efficiency curves for the amplifier arrangement of FIG. 23a.

DETAILED DESCRIPTION

Figure 1A:
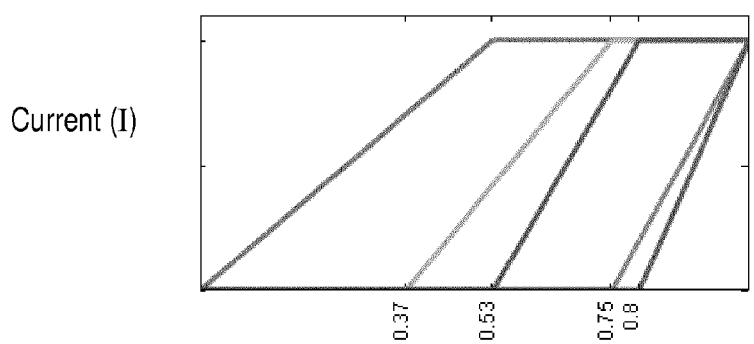
FIGS. 1a to 1c show current, voltage and efficiency curves for a known amplifier arrangement.
Figure 1B:
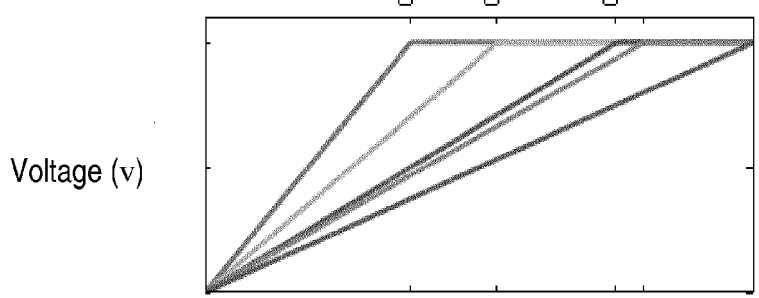
Figure 1C:
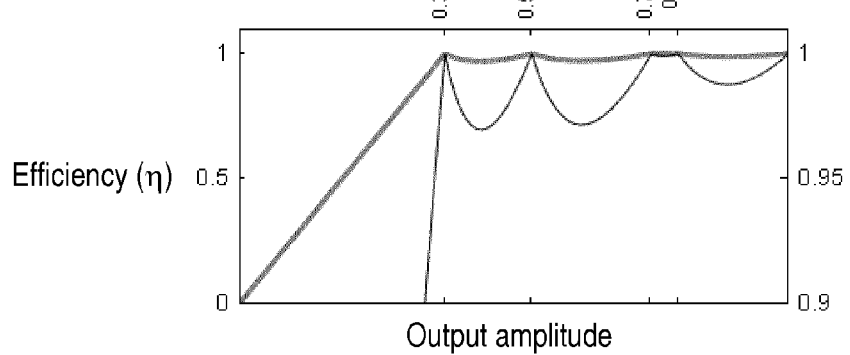
Figure 2A:
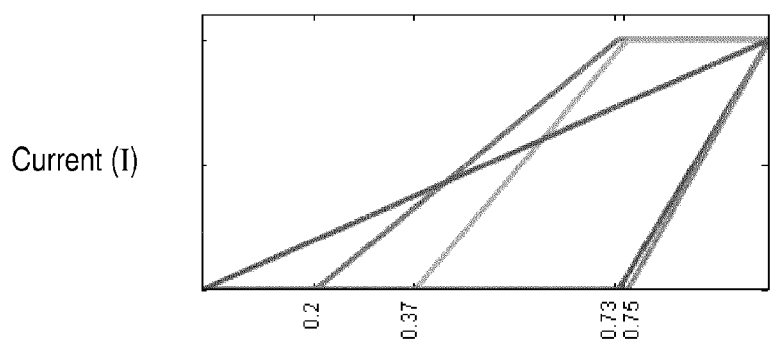
FIGS. 2a to 2c show current, voltage and efficiency curves for a known amplifier arrangement.
Figure 2B:
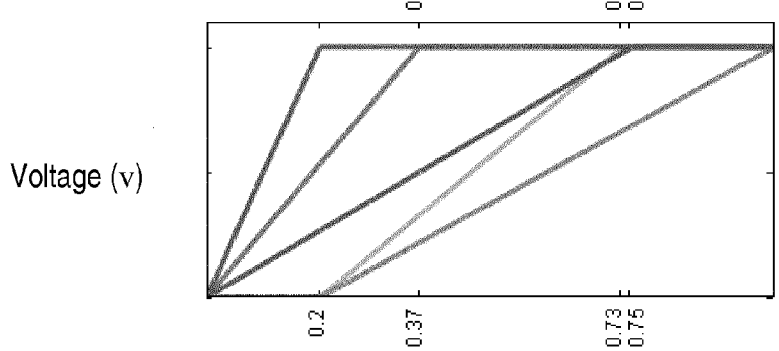
Figure 2C:
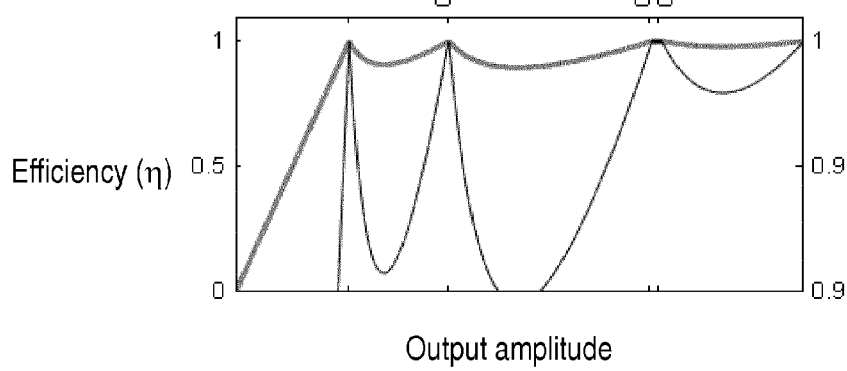
Figures 4A, 4B, 4C:
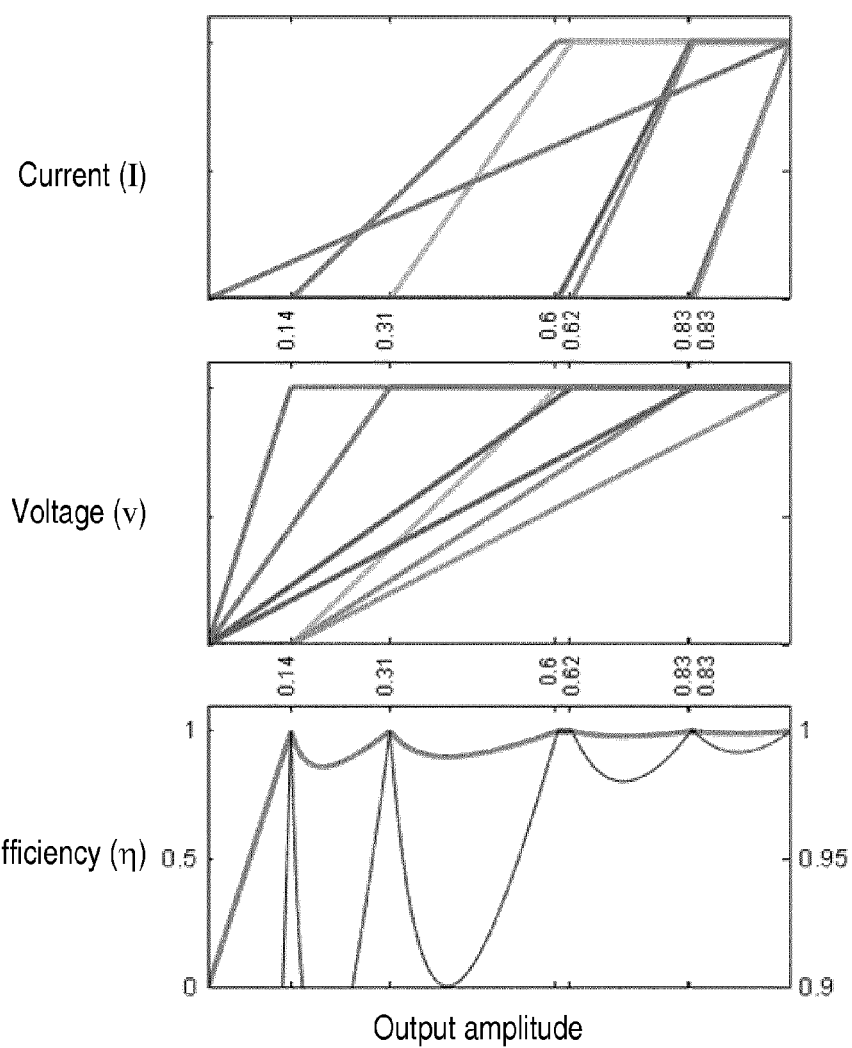
FIGS. 4a to 4c show current, voltage and efficiency curves for a known amplifier arrangement.

FIG. 5a shows an amplifier arrangement according to a first aspect of the present invention. In the example the amplifier arrangement comprises 5 amplifier stages, $10_1$ to $10_5$, although as will be described below the amplifier arrangement can comprise any higher number of amplifier stages, including both even and odd numbers of amplifier stages.

The amplifier arrangement comprises a cascade of quarter wavelength transmission line segments $11_1$ to $11_3$ coupled between an output of an amplifier of a first amplifier stage $10_1$ and an output node 15 of the amplifier arrangement. The cascade comprises three quarter wavelength transmission line segments $11_1$ to $11_3$ in this example.

At least one intermediate junction comprises a first amplifier coupled directly to the intermediate junction, and a second amplifier coupled to the same intermediate junction via a connecting quarter wavelength transmission line.

For example, in FIG. 5a intermediate junction $12_2$ of the cascade of quarter wavelength transmission line segments comprises a first amplifier $10_3$ (of the third amplifier stage) coupled directly to the intermediate junction $12_2$, and a second amplifier $10_4$ (of the fourth amplifier stage) coupled to the same intermediate junction $12_2$ via a connecting quarter wavelength transmission line $13_1$.

According to an embodiment as shown in FIG. 5a, which comprises five amplifier stages, and wherein the cascade comprises N-2 quarter wavelength transmission line segments $11_1$ to $11_{N-2}$, the amplifier $10_5$ of the 5th stage is coupled directly to the output node 15. According to another embodiment as described below in FIG. 6a, however, the amplifier $10_5$ of the 5th stage is coupled to the output node 15 via a connecting quarter wavelength transmission line $13_2$.

In the example of FIG. 5a the amplifier $10_1$ of the first amplifier stage and the amplifier $10_2$ of the second amplifier stage are coupled directly to respective junctions of the cascade of quarter wavelength transmission line segments.

The quarter wavelength transmission line segments $11_1$ to $11_3$ are shown as having a decreasing characteristic impedance towards the output node 15 (represented by the comparative thickness of each quarter wavelength transmission line $11_1$ to $11_3$). Although the embodiments described herein will be described as having a cascade of quarter wavelength transmission line segments with decreasing characteristic impedance towards the output node, it is noted that transformations may be provided in a network, as described later in the application, for providing the same effect as a deceasing characteristic impedance. The use of such transformations in the network might be beneficial when physical constraints are imposed on the amplifier arrangement, for example because of the physical size of the transmission lines required to give a particular characteristic impedance.

This arrangement has the advantage of providing good efficiency for high PAR signals even with equal size transistors, due to high density of transition points at low output amplitudes.

FIG. 5b shows a plot of current against output amplitude for the five-stage embodiment of the present invention as shown in FIG. 5a. The order of the amplifier starting points in this example is amplifier $10_4$ starting at zero, amplifier $10_1$ starting at 0.25 of full output amplitude, amplifier $10_2$ starting at 0.4 of full output amplitude, amplifier $10_3$ starting at 0.75 of full output amplitude, and amplifier $10_5$ starting at 0.8 of full output amplitude.

FIG. 5c shows a plot of voltage against output amplitude for the five-stage embodiment of the present invention as shown in FIG. 5a.

FIG. 5d shows a plot of efficiency against output amplitude for the five-stage embodiment of the present invention as shown in FIG. 5a.

Figure 6A:
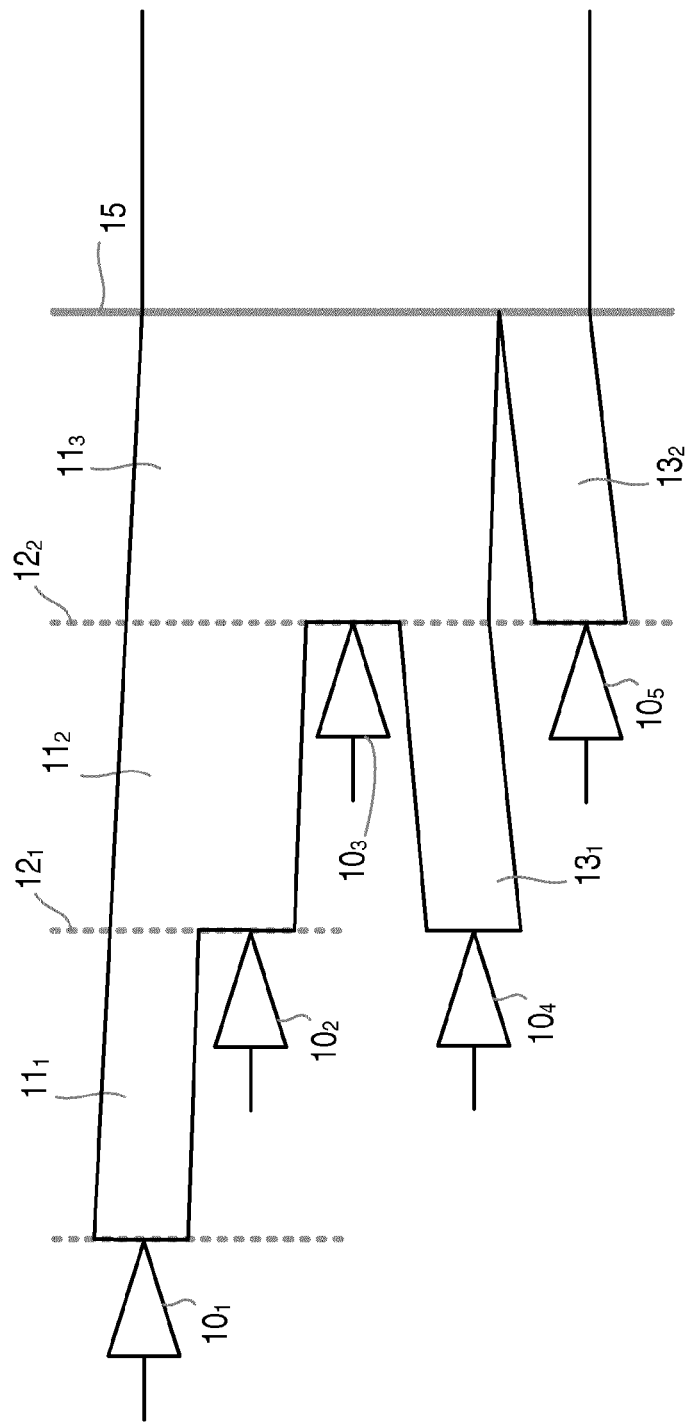
FIG. 6a shows an amplifier arrangement according to another embodiment of the present invention.

The embodiment of FIG. 6a is similar to that of FIG. 5a in that it shows an amplifier arrangement comprising five amplifier stages, $10_1$ to $10_5$, and a cascade of quarter wavelength transmission line segments $11_1$ to $11_3$ coupled between an output of an amplifier of a first amplifier stage $10_1$ and an output node 15 of the amplifier arrangement. The cascade comprises three quarter wavelength transmission line segments $11_1$ to $11_3$ in this example.

At least one intermediate junction comprises a first amplifier coupled directly to the intermediate junction, and a second amplifier coupled to the same intermediate junction via a connecting quarter wavelength transmission line. In the example of FIG. 6a intermediate junction $12_2$ of the cascade of quarter wavelength transmission line segments comprises a first amplifier $10_3$ (of the third amplifier stage) coupled directly to the intermediate junction $12_2$, and a second amplifier $10_4$ (of the fourth amplifier stage) coupled to the same intermediate junction $12_2$ via a connecting quarter wavelength transmission line $13_1$.

FIG. 6a the amplifier $10_5$ of the 5th stage is coupled to the output node 15 via a connecting quarter wavelength transmission line $13_2$. In the example of FIG. 6a, as with FIG. 5a the amplifier $10_1$ of the first amplifier stage and the amplifier $10_2$ of the second amplifier stage are coupled directly to respective junctions of the cascade of quarter wavelength transmission line segments.

Figure 6B:
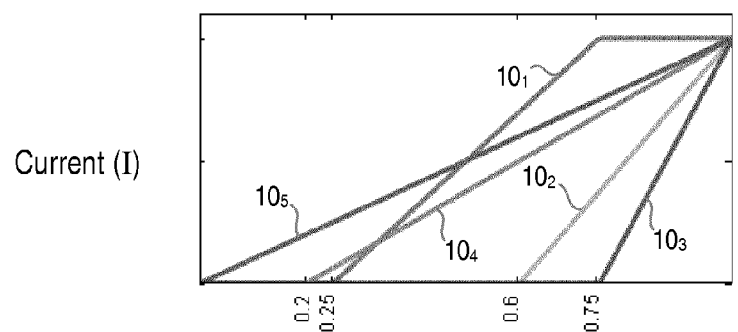

FIG. 6b shows a plot of current against output amplitude for the five-stage embodiment of the present invention as shown in FIG. 6a. The order of the amplifier starting points in this example is amplifier $10_5$ starting at zero, amplifier $10_4$ starting at 0.2 of full output amplitude, amplifier $10_1$ starting at 0.25 of full output amplitude, amplifier $10_2$ starting at 0.6 of full output amplitude, and amplifier $10_3$ starting at 0.75 of full output amplitude.

Figure 6C:
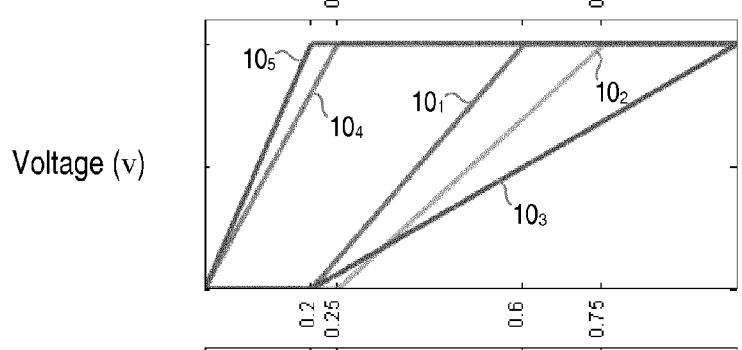

FIG. 6c shows a plot of voltage against output amplitude for the five-stage embodiment of the present invention as shown in FIG. 6a.

Figure 6D:
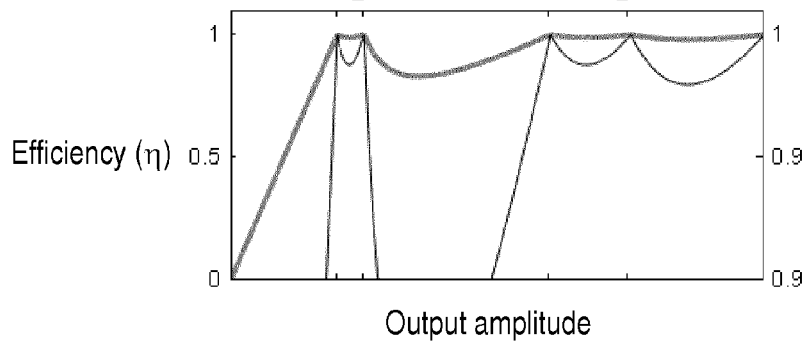

FIG. 6d shows a plot of efficiency against output amplitude for the five-stage embodiment of the present invention as shown in FIG. 6a.

From the above it can be seen that embodiments of the present invention provide a class of multistage Doherty amplifiers that, at a junction between the quarter wavelength lines in the quarterwave cascade (i.e. not the output), have both a sub-amplifier/transistor coupled via a quarter wavelength transmission line, and one coupled directly. This gives rise to new current, voltage and efficiency curve behaviours compared to prior art multistage Doherty amplifiers, and thus provides additional ways to achieve desired efficiency curves when only a limited set of transistor sizes are available.

It can therefore be seen from FIGS. 5a and 6a that, the difference between the embodiments is that, in the embodiment of FIG. 6a the amplifier $10_5$ of the fifth stage is the starting amplifier (i.e. the one active at the lowest output amplitudes), and is the lowermost one that is coupled via a quarterwave line to the output node 15, while in the embodiment of FIG. 5a the lowermost amplifier $10_5$ of the fifth stage is coupled directly to the output node 15 and is only active at the highest output amplitudes. The order of the starting points of the four topmost amplifiers $10_1$ to $10_4$ are the same for both embodiments, with the amplifier $10_4$ of the fourth stage being the starting amplifier for the embodiment of FIG. 5a, but the second to start for the embodiment of FIG. 6a.

Since an RF transistor amplifier has high output impedance (ideally infinite) a quarter wavelength line with an amplifier at one end will look as a low impedance (ideally a RF short circuit) at the other end. The connecting quarter wavelength transmission line $13_1$ coupled to the output of amplifier $10_4$ will therefore short circuit the junction of the quarterwave cascade where it is connected, so that no preceding amplifier can start before the amplifier $10_4$ of the fourth stage. The amplifiers $10_1$ through $10_3$ of the preceding stages thus act as what are referred to as peaking amplifiers to amplifier $10_4$ of the fourth stage.

Figure 6E:
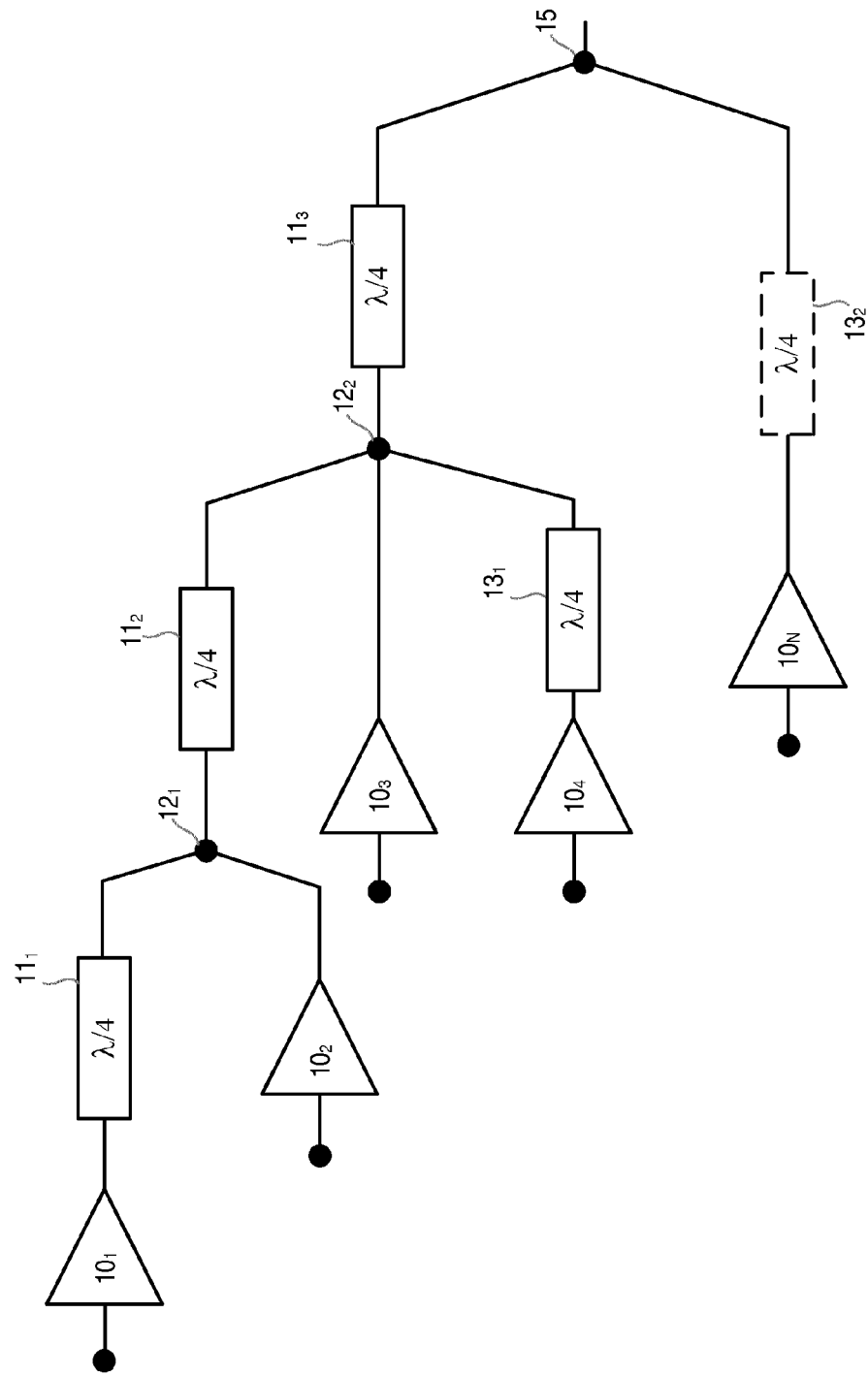
FIG. 6e shows a schematic diagram of the amplifier arrangement according to an embodiment of FIGS. 5a (and 6a including the portion in dotted lines)

FIG. 6e shows the embodiments of FIGS. 5a and 6a drawn differently, (the embodiment of FIG. 5a corresponding to that of FIG. 6e without the dotted connecting quarter wavelength transmission line $13_2$, and the embodiment of FIG. 6a corresponding to that of FIG. 6e with the dotted connecting quarter wavelength transmission line $13_2$).

It is noted that the other embodiments of the invention, as described below, can be represented using similar schematic diagrams.

FIGS. 7a to 7d and FIGS. 8a to 8d correspond to two further embodiments of the present invention, in which six constituent amplifiers of equal size are used in the amplifier arrangement.

The respective behaviours of these six-stage embodiments are similar to the five-stage embodiments above. The amplitude-wise order of the starting points of amplifiers one through four are the same for both embodiments and the same as for the four topmost amplifiers of the previous two embodiments.

Figure 7A:
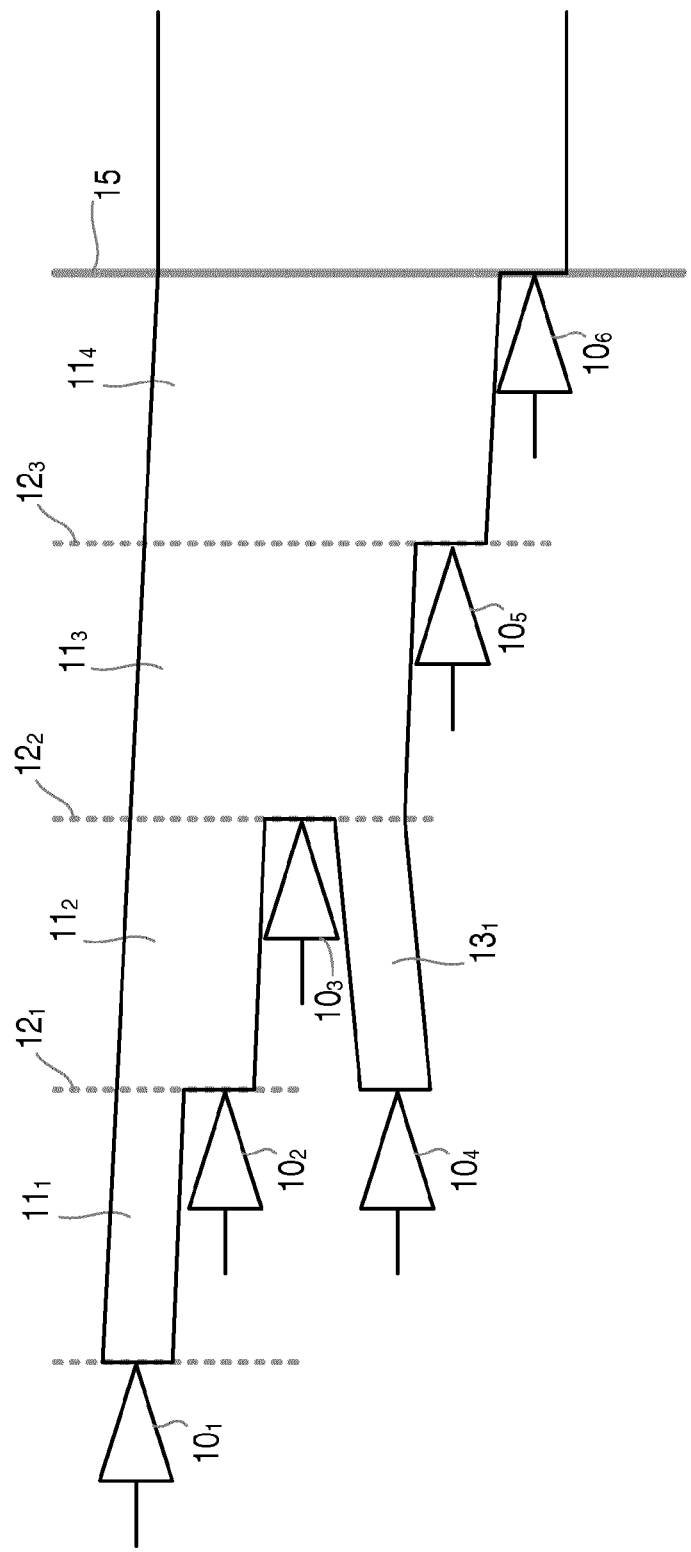
FIG. 7a shows an amplifier arrangement according to another embodiment of the present invention.

The amplifier arrangement of FIG. 7a comprises six amplifier stages, $10_1$ to $10_6$. The amplifier arrangement comprises a cascade of quarter wavelength transmission line segments $11_1$ to $11_4$ coupled between an output of an amplifier of a first amplifier stage $10_1$ and an output node 15 of the amplifier arrangement. The cascade comprises four quarter wavelength transmission line segments $11_1$ to $11_4$ in this example.

At least one intermediate junction comprises a first amplifier coupled directly to the intermediate junction, and a second amplifier coupled to the same intermediate junction via a connecting quarter wavelength transmission line.

In the example of FIG. 7a intermediate junction $12_2$ of the cascade of quarter wavelength transmission line segments comprises a first amplifier $10_3$ (of the third amplifier stage) coupled directly to the intermediate junction $12_2$, and a second amplifier $10_4$ (of the fourth amplifier stage) coupled to the same intermediate junction $12_2$ via a connecting quarter wavelength transmission line $13_1$.

In this particular embodiment, where the cascade comprises N-2 quarter wavelength transmission line segments $11_1$ to $11_{N-2}$, the amplifiers $10_5$ and $10_6$ of the 5th and 6th stages are coupled directly to the output node 15.

Figure 8A:
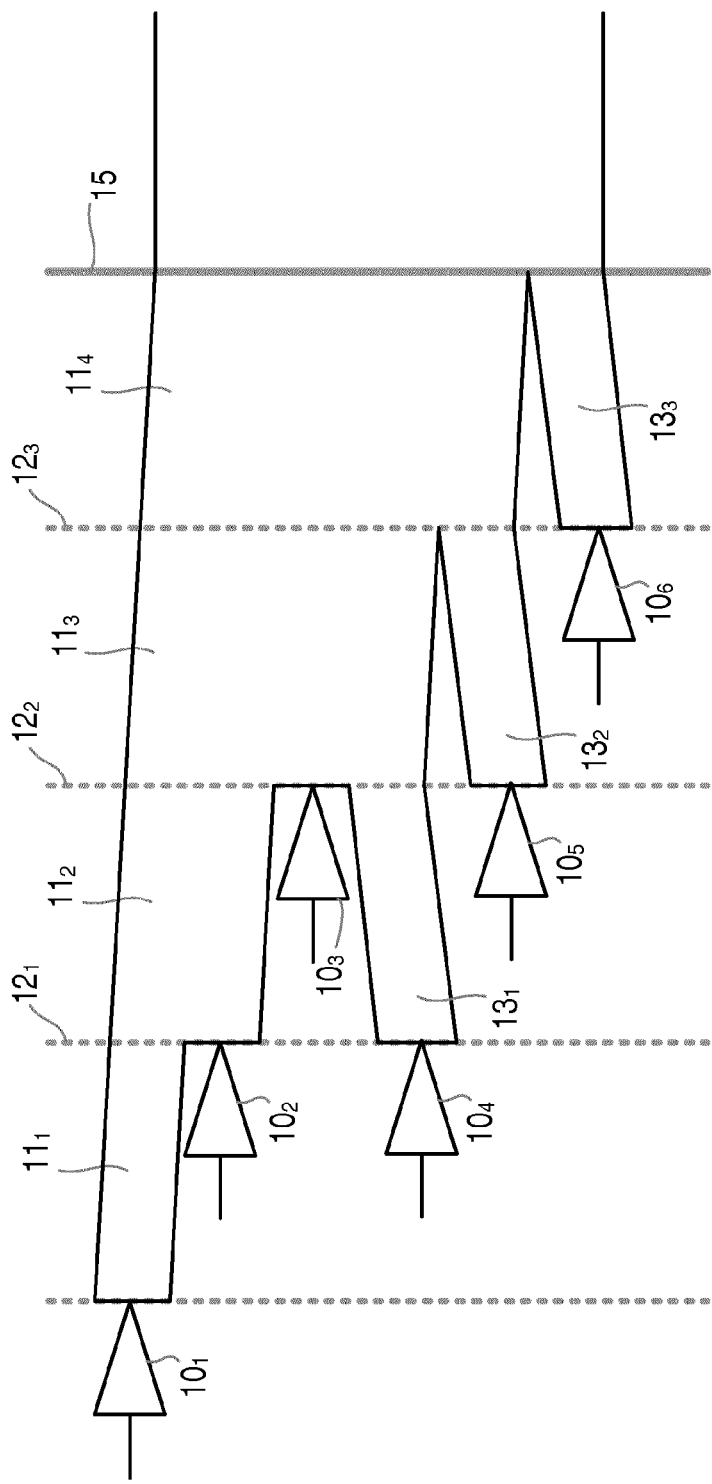
FIG. 8a shows an amplifier arrangement according to another embodiment of the present invention.

The embodiment of FIG. 8a is similar to that of FIG. 7a, but in FIG. 8a the amplifiers $10_5$ and $10_6$ of the 5th and $6^{th}$ stages are coupled to the output node 15 via connecting quarter wavelength transmission lines $13_2$ and $13_3$, respectively.

In both the embodiments of FIGS. 7a and 8a, the amplifier $10_1$ of the first amplifier stage and the amplifier $10_2$ of the second amplifier stage are coupled directly to respective junctions of the cascade of quarter wavelength transmission line segments.

As with the previous embodiments, the quarter wavelength transmission line segments $11_1$ to $11_4$ are shown as having a decreasing characteristic impedance towards the output node 15 (represented by the comparative thickness of each quarter wavelength transmission line $11_1$ to $11_4$).

Figure 7B:
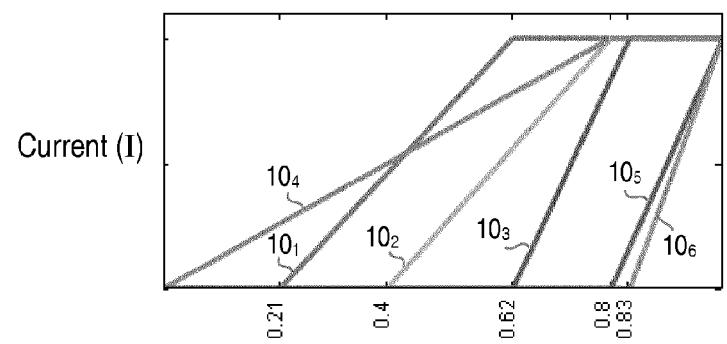

FIG. 7b shows a plot of current against output amplitude for the six-stage embodiment of the present invention as shown in FIG. 7a. The order of the amplifier starting points in this example is amplifier $10_4$ starting at zero, amplifier $10_1$ starting at 0.21 of full output amplitude, amplifier $10_2$ starting at 0.4 of full output amplitude, amplifier $10_3$ starting at 0.62 of full output amplitude, amplifier $10_5$ starting at 0.8 of full output amplitude, and amplifier $10_6$ starting at 0.83 of full output amplitude.

Figure 7C:
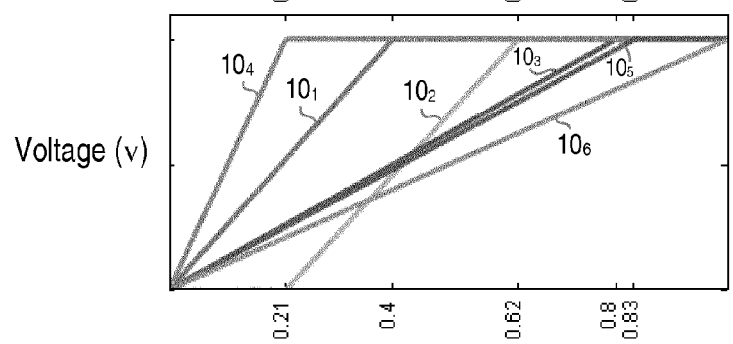

FIG. 7c shows a plot of voltage against output amplitude for the six-stage embodiment of the present invention as shown in FIG. 7a.

Figure 7D:
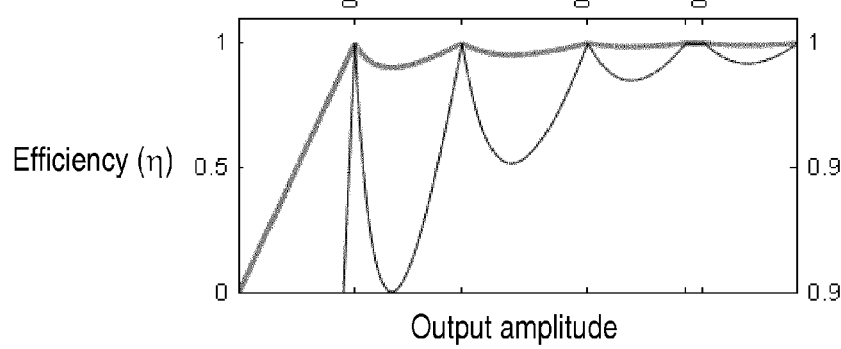

FIG. 7d shows a plot of efficiency against output amplitude for the six-stage embodiment of the present invention as shown in FIG. 7a.

Figure 8B:
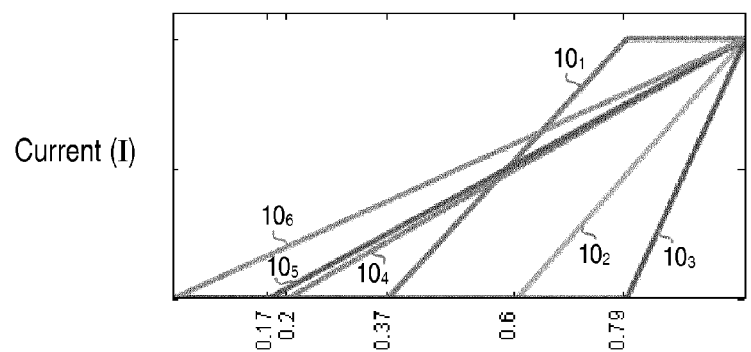

FIG. 8b shows a plot of current against output amplitude for the six-stage embodiment of the present invention as shown in FIG. 8a. The order of the amplifier starting points in this example is amplifier $10_6$ starting at zero, amplifier $10_5$ starting at 0.17 of full output amplitude, amplifier $10_4$ starting at 0.2 of full output amplitude, amplifier $10_1$ starting at 0.37 of full output amplitude, amplifier $10_2$ starting at 0.6 of full output amplitude, and amplifier $10_3$ starting at 0.79 of full output amplitude.

Figure 8C:
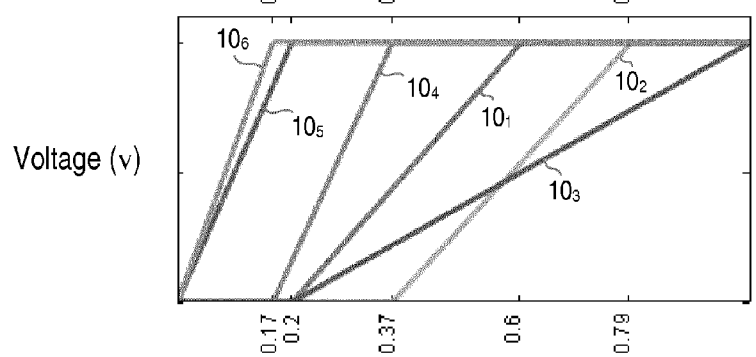

FIG. 8c shows a plot of voltage against output amplitude for the six-stage embodiment of the present invention as shown in FIG. 8a.

Figure 8D:
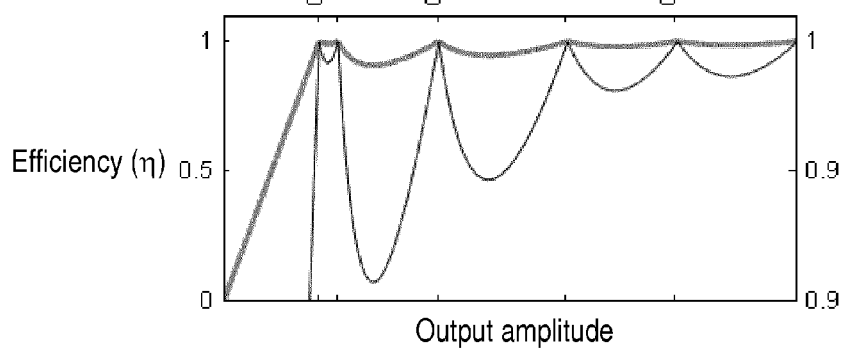

FIG. 8d shows a plot of efficiency against output amplitude for the six-stage embodiment of the present invention as shown in FIG. 8a.

The embodiments of FIGS. 7a and 8a therefore differ as follows. In the embodiment of FIG. 7a the amplifier $10_4$ of the fourth stage is the one active at the lowest output amplitudes, with the amplifiers $10_5$ and $10_6$, i.e. the ones which are coupled directly to the quarterwave cascade, only being active at the highest output amplitudes (i.e. only starting at 0.8 and 0.83 of full output amplitude, respectively). In the embodiment of FIG. 8a, however, the starting amplifier (the one active at the lowest output amplitudes) is the amplifier $10_6$ of the sixth stage, with amplifier $10_5$ of the fifth stage being the second amplifier to become active with increasing amplitude.

The embodiments of FIGS. 7a and 8a therefore comprise six amplifier stages $10_1$ to $10_6$, and the cascade comprises N-2 quarter wavelength transmission line segments $11_1$ to $11_4$. In FIG. 7a the amplifier $10_5$ of the fifth stage is directly coupled to a respective junction $12_3$ of the cascade of quarter wavelength transmission line segments, and the amplifier $10_6$ of the sixth stage coupled directly to the output node. In FIG. 8a the amplifier $10_5$ of the fifth stage is coupled to a respective junction $12_3$ of the cascade of quarter wavelength transmission line segments via a connecting quarter wavelength transmission line $13_2$, and an amplifier $10_6$ of the sixth stage coupled to the output node 15 via a connecting quarter wavelength transmission line $13_3$.

FIGS. 9a to 9d show another embodiment of a six-stage amplifier arrangement, which effectively incorporates the behaviors of both of the five-stage variants described in FIGS. 5a and 6a above, since it has both an amplifier coupled directly to the output 15 (the amplifier $10_5$ of the fifth stage), and an amplifier coupled via a quarter wavelength line to the output (the amplifier $10_6$ of the sixth stage, coupled via connecting quarter wavelength transmission line $13_2$). The amplifier $10_6$ of the sixth stage (coupled via the quarter wavelength line) is thus the starting amplifier, and the amplifier $10_5$ of the fifth stage (coupled directly) will be the last peaking amplifier, which will be active only in the uppermost region. The amplifiers $10_1$ to $10_4$ of the first to fourth stages have the same general behavior in this embodiment of FIG. 9a, as they do in the previous examples.

Figure 9A:
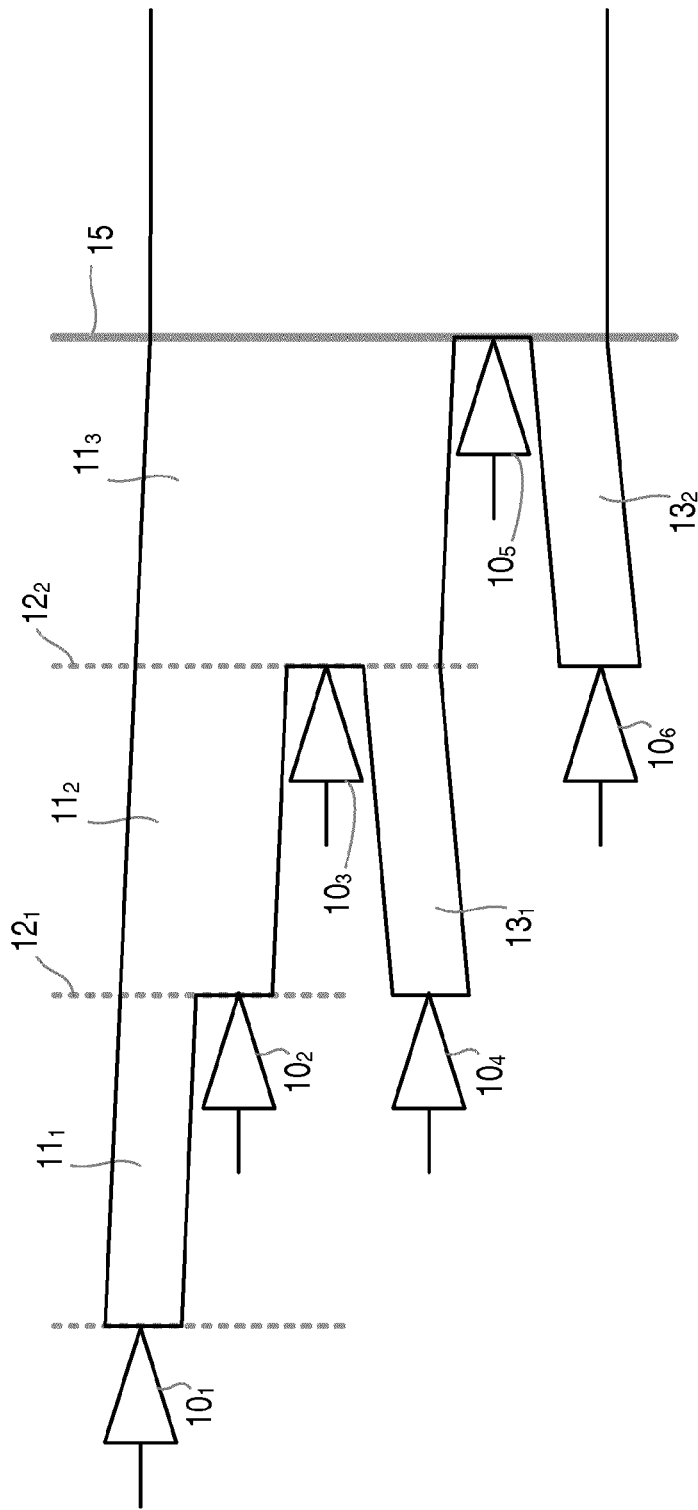
FIG. 9a shows an amplifier arrangement according to another embodiment of the present invention.

Thus, from FIG. 9a it can be seem that the amplifier comprises six amplifier stages $10_1$ to $10_6$, and the cascade comprises N-3 quarter wavelength transmission line segments $11_1$ to $11_3$, and wherein, and wherein an amplifier $10_5$ of the fifth stage is coupled directly to the output node, and an amplifier $10_6$ of the sixth stage coupled to the output node 15 via a connecting quarter wavelength transmission line $13_2$.

Figure 9B:
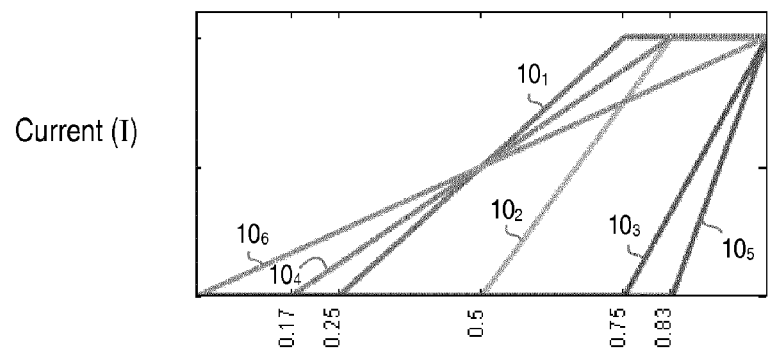

FIG. 9b shows a plot of current against output amplitude for the six-stage embodiment of the present invention as shown in FIG. 9a. The order of the amplifier starting points in this example is amplifier $10_6$ starting at zero, amplifier $10_4$ starting at 0.17 of full output amplitude, amplifier $10_1$ starting at 0.25 of full output amplitude, amplifier $10_2$ starting at 0.5 of full output amplitude, amplifier $10_3$ starting at 0.75 of full output amplitude, and amplifier $10_5$ starting at 0.83 of full output amplitude.

Figure 9C:
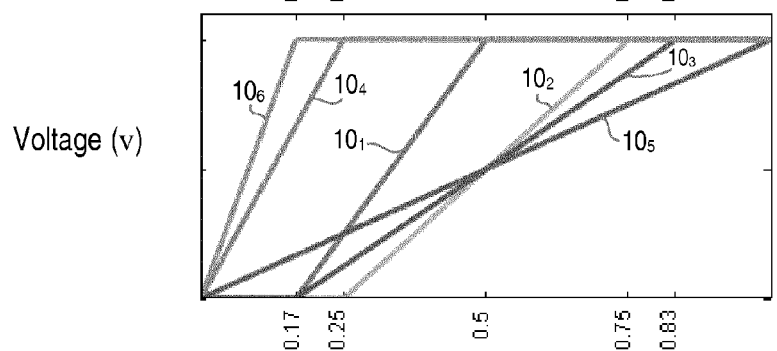

FIG. 9c shows a plot of voltage against output amplitude for the six-stage embodiment of the present invention as shown in FIG. 9a.

Figure 9D:
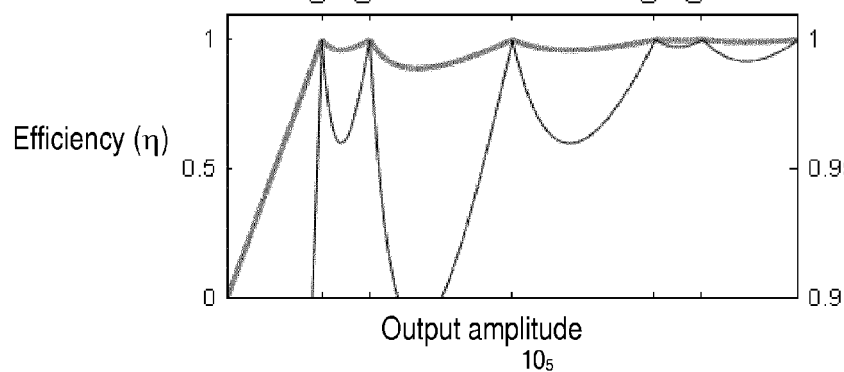

FIG. 9d shows a plot of efficiency against output amplitude for the six-stage embodiment of the present invention as shown in FIG. 9a.

FIGS. 10 to 19 show examples of 7-stage implementations according to embodiments of the present invention.

In the examples of the 7-stage embodiments shown in a first set of FIGS. 10 to 13, the junction having both a directly connected and a quarterwave-connected amplifier is placed two steps further towards the output 15, i.e. thus extending the input side such that there are four preceding quarter wavelength transmission line segments $11_1$ to $11_4$ in the cascade, prior to this junction. Thus, in the arrangements shown in the embodiments of FIGS. 10a to 13a, the junction having both a directly connected and quarterwave-connected amplifier is the junction preceding the output 15, shown as junction $12_4$. In these examples an amplifier $10_5$ of the fifth stage is coupled directly to the junction $12_4$, while an amplifier of the sixth stage $10_6$ is coupled to the junction $12_4$ via a connecting quarter wavelength transmission line $13_1$.

As in the previous examples, the single quarterwave-connected amplifier at this junction (the amplifier of the sixth stage $10_6$ in this example) is used in combination with the preceding stages which have a high impedance.

According to some examples, such as the embodiments of FIGS. 10a and 13a, the preceding stages comprise a cascade of four quarterwave lines with directly connected amplifiers. The output node having the amplifier $10_7$ of the seventh stage coupled thereto has the options of a quarterwave-connected amplifier (as shown in FIG. 13a), or a directly connected amplifier (as shown in FIG. 10a).

According to other examples, the junction $12_3$, i.e. the junction preceding the junction having both a directly connected and quarterwave-connected amplifier (i.e. preceding junction $12_4$), comprises a quarterwave-connected amplifier one quarterwave segment away. In other words, in FIGS. 11a and 12a, the amplifier $10_4$ of the fourth stage is coupled via a connecting quarter wavelength transmission line $13_3$. In these embodiments of FIGS. 11a and 12a, the next to last preceding junction also comprises a quarterwave-connected amplifier coupled thereto. In other words, the amplifier $10_3$ of the third stage is coupled via a connecting quarter wavelength transmission line $13_2$.

It is noted that this can be generalized to higher order structures, particularly in the case where even numbers of preceding stages are provided, i.e. an even number of quarter wavelength lines in the preceding quarterwave cascade.

Figure 11A:
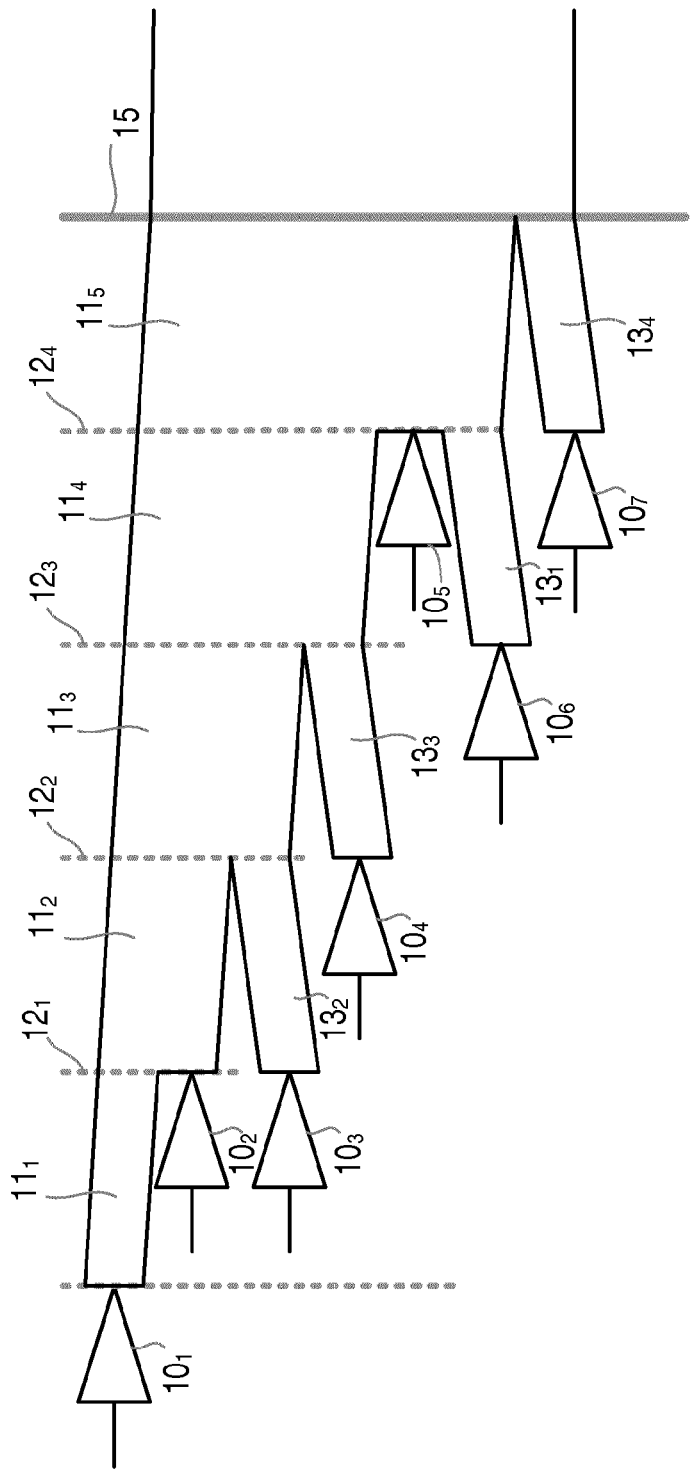
FIG. 11a shows an amplifier arrangement according to another embodiment of the present invention.
Figure 12A:
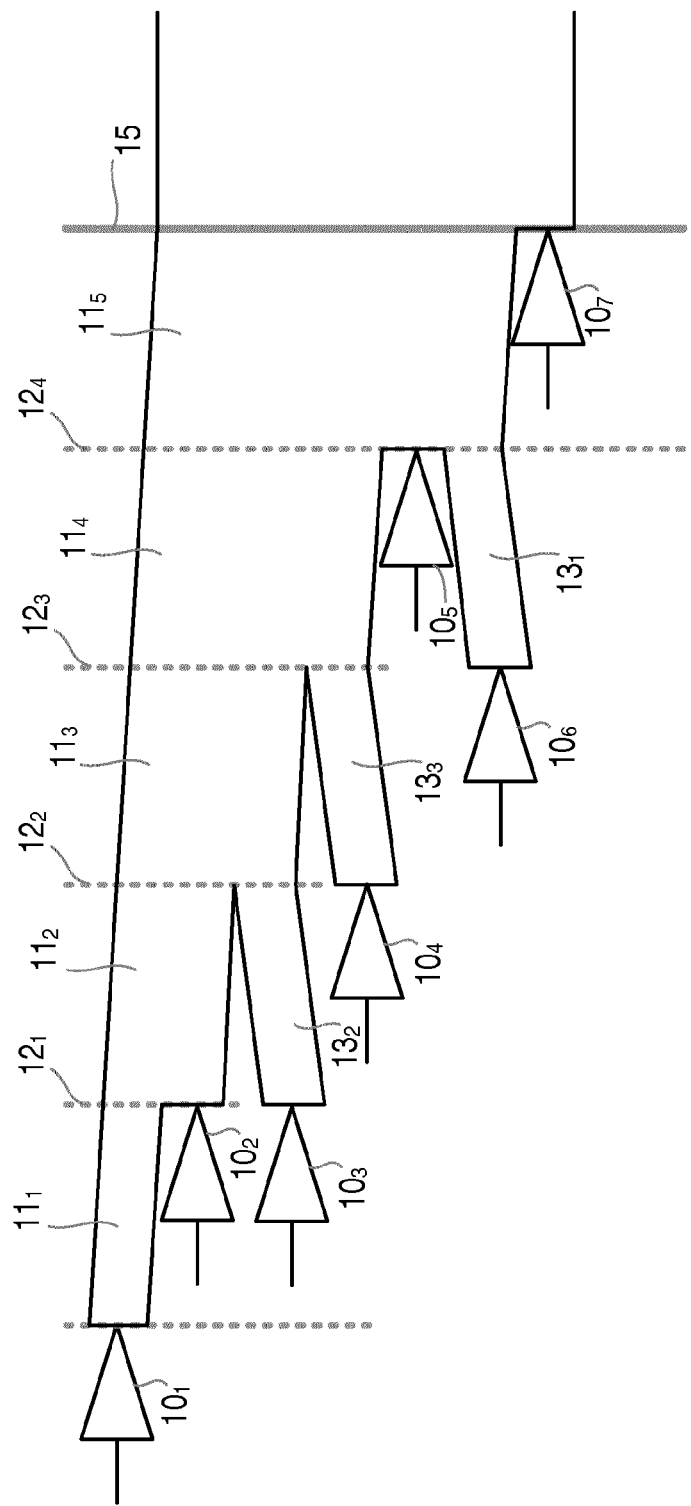
FIG. 12a shows an amplifier arrangement according to another embodiment of the present invention.

Since for both these embodiments of FIGS. 11a and 12a the last junction of this six-amplifier structure has a quarterwave-connected amplifier, the output node having the amplifier $10_7$ of the seventh stage coupled thereto has the options of a quarterwave-connected amplifier (as shown in FIG. 11a), or a directly connected amplifier (as shown in FIG. 12a).

Next, an explanation will be given of the starting orders of the arrangements of the examples of FIGS. 10a to 13a, and the associated graphs.

Figures 10B, 10C, 10D:
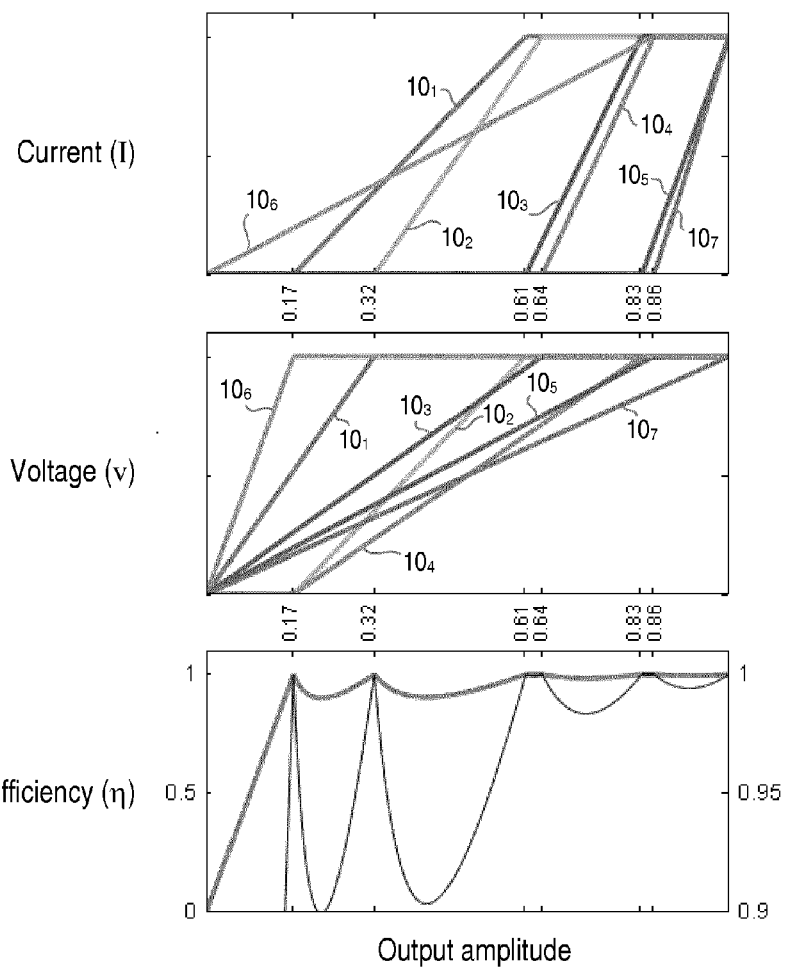

FIG. 10b shows a plot of current against output amplitude for the seven-stage embodiment of the present invention as shown in FIG. 10a. The order of the amplifier starting points in this example is amplifier $10_6$ starting at zero, amplifier $10_1$ starting at 0.17 of full output amplitude, amplifier $10_2$ starting at 0.32 of full output amplitude, amplifier $10_3$ starting at 0.61 of full output amplitude, amplifier $10_4$ starting at 0.64 of full output amplitude, amplifier $10_5$ starting at 0.83 of full output amplitude, and amplifier $10_7$ starting at 0.86 of full output amplitude.

FIG. 10c shows a plot of voltage against output amplitude for the seven-stage embodiment of the present invention as shown in FIG. 10a.

FIG. 10d shows a plot of efficiency against output amplitude for the seven-stage embodiment of the present invention as shown in FIG. 10a.

Figure 11B:
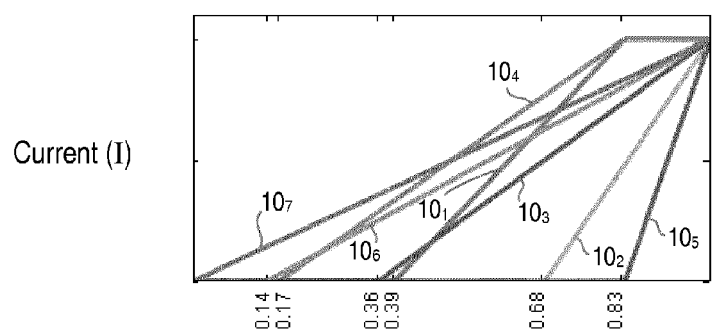

FIG. 11b shows a plot of current against output amplitude for the seven-stage embodiment of the present invention as shown in FIG. 11a. The order of the amplifier starting points in this example is amplifier $10_7$ starting at zero, amplifier $10_6$ starting at 0.14 of full output amplitude, amplifier $10_4$ starting at 0.17 of full output amplitude, amplifier $10_3$ starting at 0.36 of full output amplitude, amplifier $10_1$ starting at 0.39 of full output amplitude, amplifier $10_2$ starting at 0.68 of full output amplitude, and amplifier $10_5$ starting at 0.83 of full output amplitude.

Figure 11C:
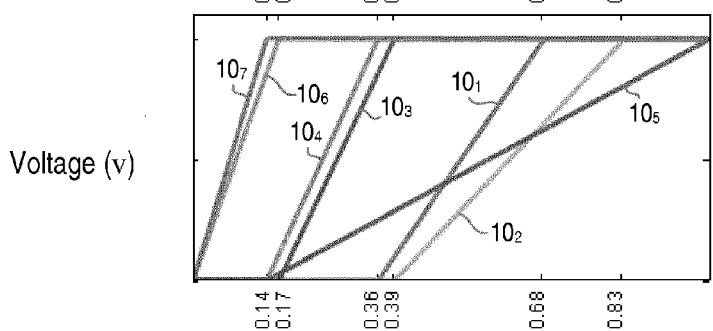

FIG. 11c shows a plot of voltage against output amplitude for the seven-stage embodiment of the present invention as shown in FIG. 11a.

Figure 11D:
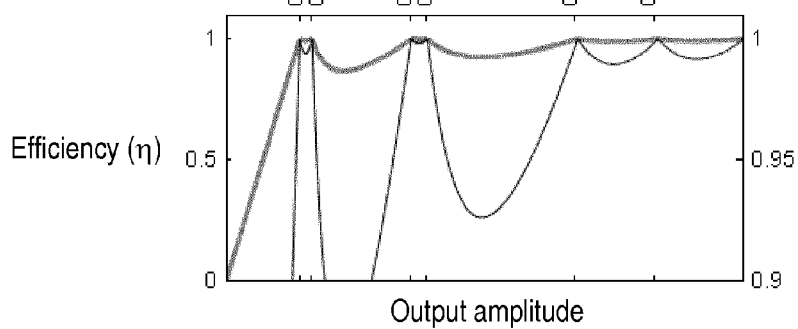

FIG. 11d shows a plot of efficiency against output amplitude for the seven-stage embodiment of the present invention as shown in FIG. 11a.

Figure 12B:
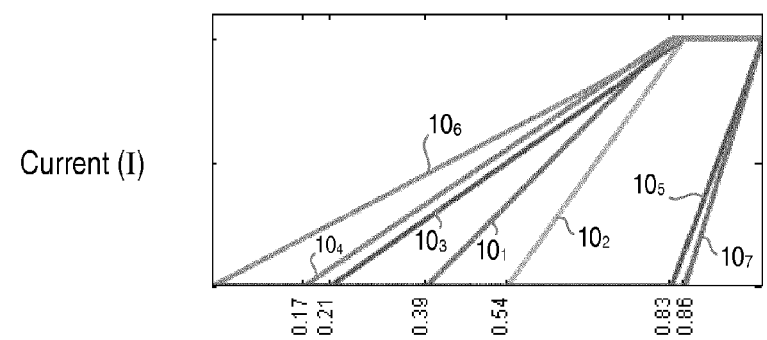

FIG. 12b shows a plot of current against output amplitude for the seven-stage embodiment of the present invention as shown in FIG. 12a. The order of the amplifier starting points in this example is amplifier $10_6$ starting at zero, amplifier $10_4$ starting at 0.17 of full output amplitude, amplifier $10_3$ starting at 0.21 of full output amplitude, amplifier $10_1$ starting at 0.39 of full output amplitude, amplifier $10_2$ starting at 0.54 of full output amplitude, amplifier $10_5$ starting at 0.83 of full output amplitude, and amplifier $10_7$ starting at 0.86 of full output amplitude.

Figure 12C:
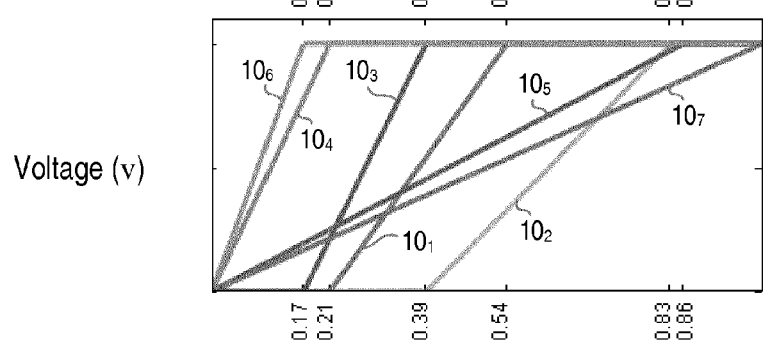

FIG. 12c shows a plot of voltage against output amplitude for the seven-stage embodiment of the present invention as shown in FIG. 12a.

Figure 12D:
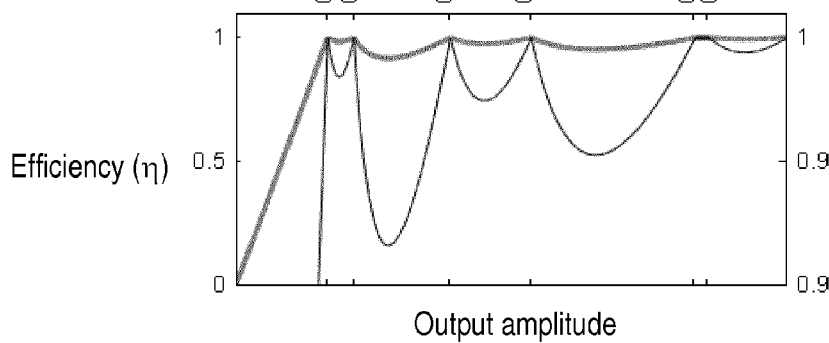

FIG. 12d shows a plot of efficiency against output amplitude for the seven-stage embodiment of the present invention as shown in FIG. 12a.

Figure 13B:
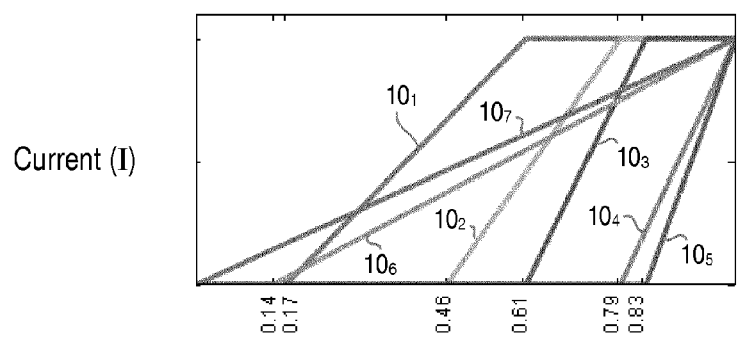

FIG. 13b shows a plot of current against output amplitude for the seven-stage embodiment of the present invention as shown in FIG. 13a. The order of the amplifier starting points in this example is amplifier $10_7$ starting at zero, amplifier $10_6$ starting at 0.14 of full output amplitude, amplifier $10_1$ starting at 0.17 of full output amplitude, amplifier $10_2$ starting at 0.46 of full output amplitude, amplifier $10_3$ starting at 0.61 of full output amplitude, amplifier $10_4$ starting at 0.79 of full output amplitude, and amplifier $10_5$ starting at 0.83 of full output amplitude.

Figure 13C:
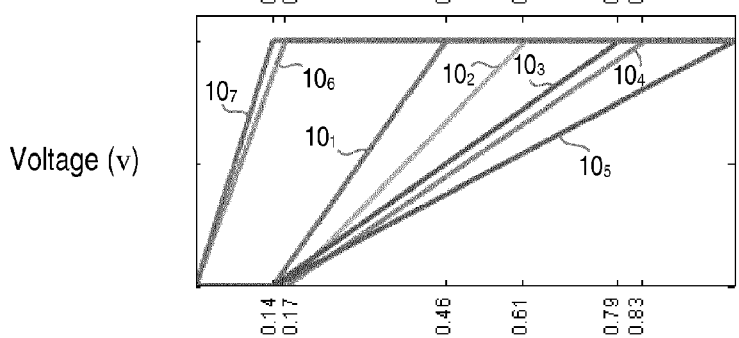

FIG. 13c shows a plot of voltage against output amplitude for the seven-stage embodiment of the present invention as shown in FIG. 13a.

Figure 13D:
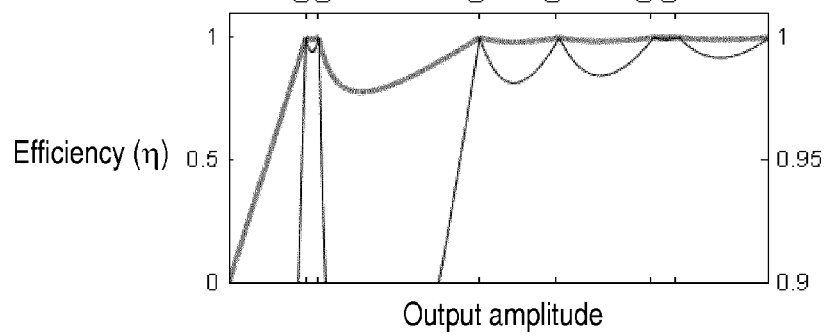

FIG. 13d shows a plot of efficiency against output amplitude for the seven-stage embodiment of the present invention as shown in FIG. 13a.

According to other set of examples of embodiments of the 7-stage amplifier described herein, the quarterwave cascade is further extended at the output side (rather than the input side as described above for FIGS. 10a to 13a), while keeping the junction having both the directly and quarterwave connected amplifiers at the same location as the examples of FIGS. 5a to 9a above. In other words, the embodiments of FIGS. 14a to 19a have the amplifier $10_3$ of the third stage coupled directly to the junction $12_2$ of the cascade, and the amplifier $10_4$ of the fourth stage coupled to the junction $12_2$ via a connecting quarter wavelength transmission line $13_1$.

Starting with the same four-amplifier structure as in the five-stage and six-stage embodiments of FIGS. 5a to 9a, FIGS. 14a to 19a show examples of six other seven-stage structures according to embodiments of the present invention.

Figure 14A:
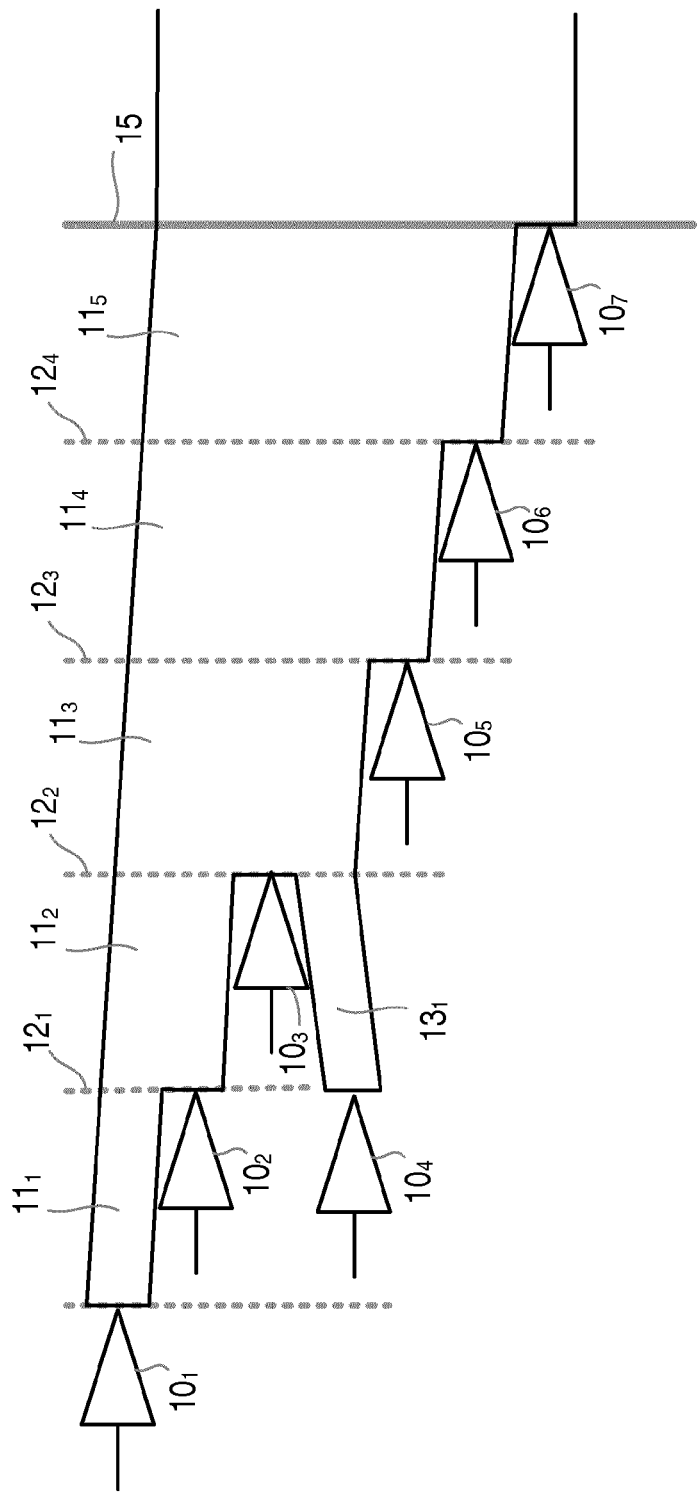
FIG. 14a shows an amplifier arrangement according to another embodiment of the present invention.
Figure 14B:
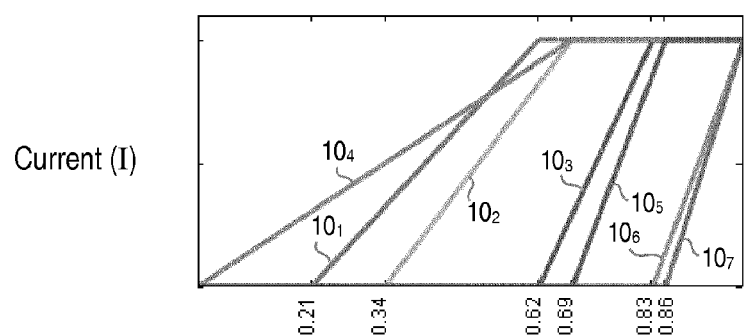
Figure 14C:
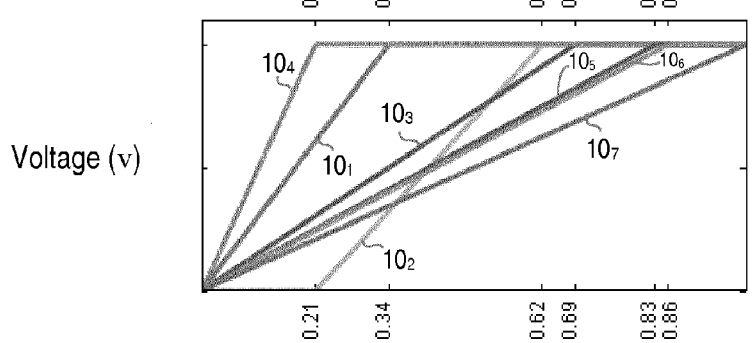
Figure 14D:
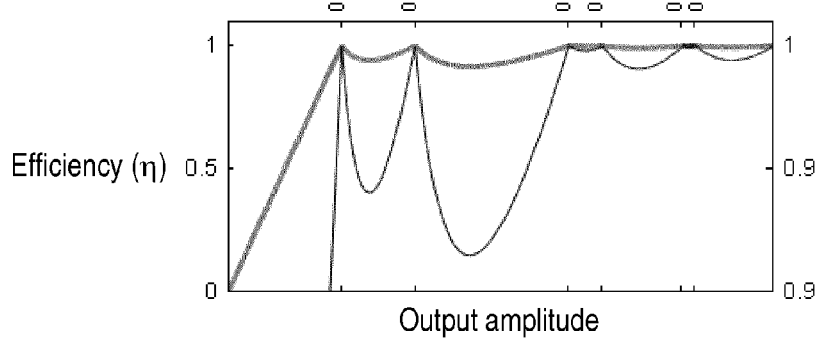
Figure 15A:
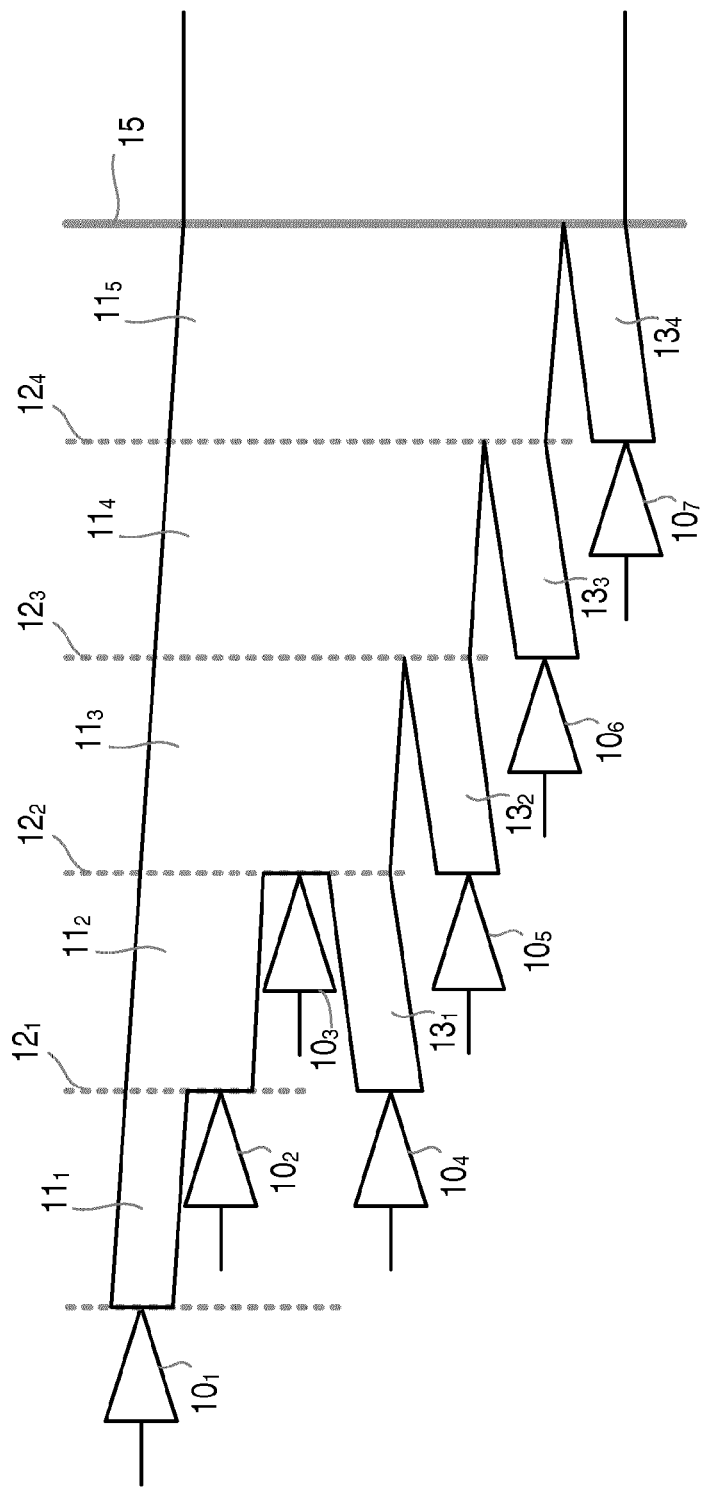
FIG. 15a shows an amplifier arrangement according to another embodiment of the present invention.
Figure 16B:
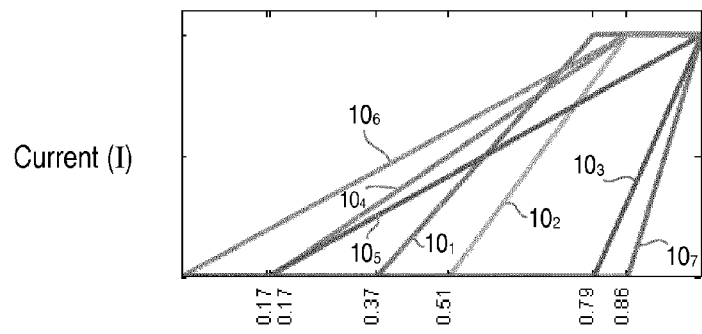
Figure 16C:
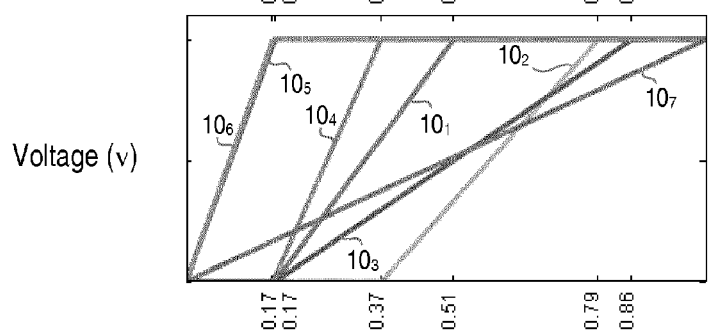
Figure 16D:
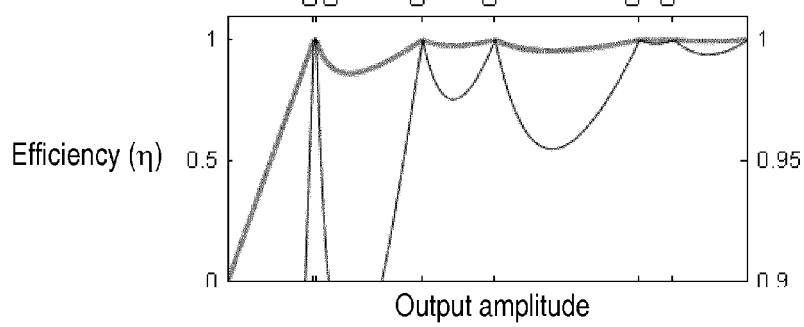
Figure 17A:
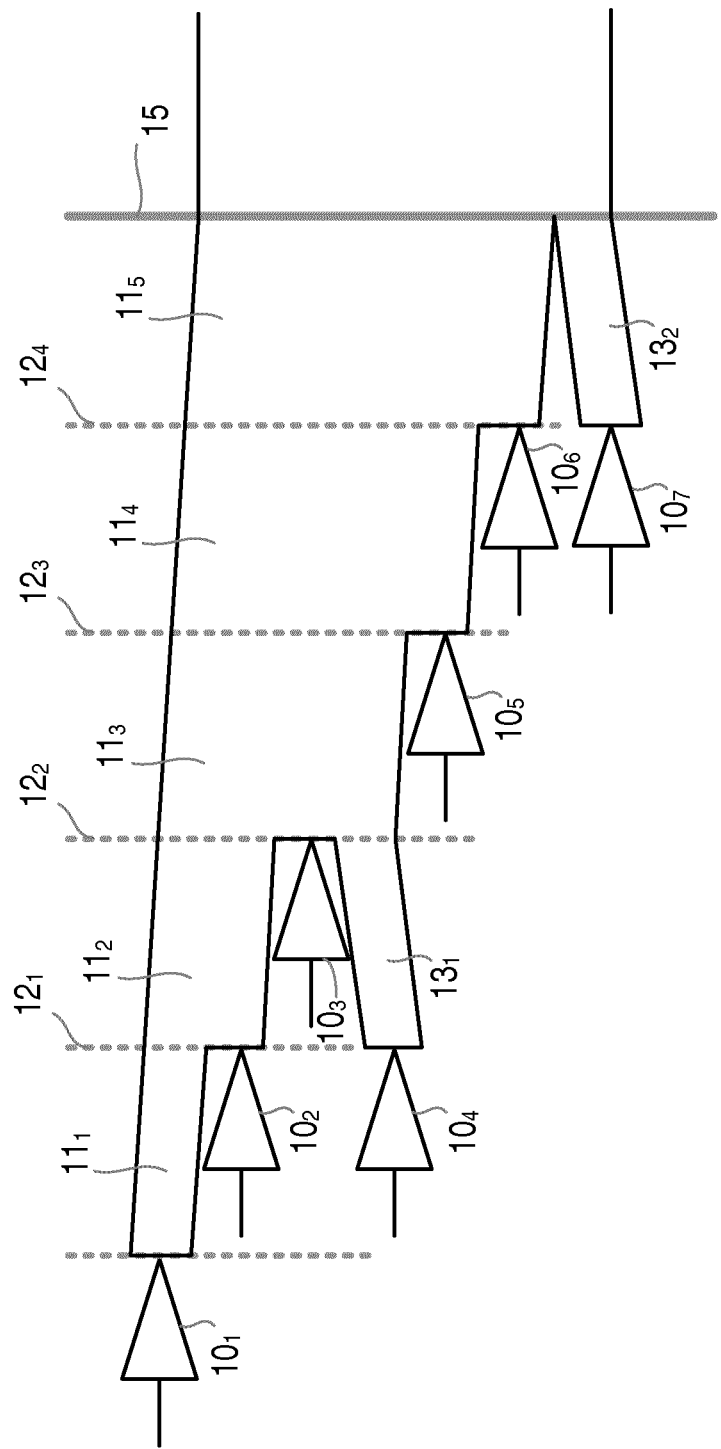
FIG. 17a shows an amplifier arrangement according to another embodiment of the present invention.

The first four of these further examples, as illustrated in FIGS. 14a to 17a, are arranged such that the three last amplifiers stages (i.e. $10_5$, $10_6$ and $10_7$) are either all directly connected to their respective junctions in the cascade of quarter wavelength transmission line segments (as shown in the embodiment of FIG. 14a), all connected via a quarter wavelength line (as shown in the embodiment of FIG. 15a), or whereby the amplifiers $10_5$ and $10_6$ of the fifth and sixth stages are connected one way (e.g. via quarter wavelength lines), and the amplifier $10_7$ of the seventh stage (last stage) connected the other way (e.g. directly), as shown in the embodiment of FIG. 16a, or vice versa, as shown in FIG. 17a (i.e. whereby the amplifiers $10_5$ and $10_6$ of the fifth and sixth stages are connected directly, and the amplifier $10_7$ of the seventh stage (last stage) connected via a quarter wavelength transmission line).

It is noted that this type of extension on the output side can be extended indefinitely.

Figure 18B:
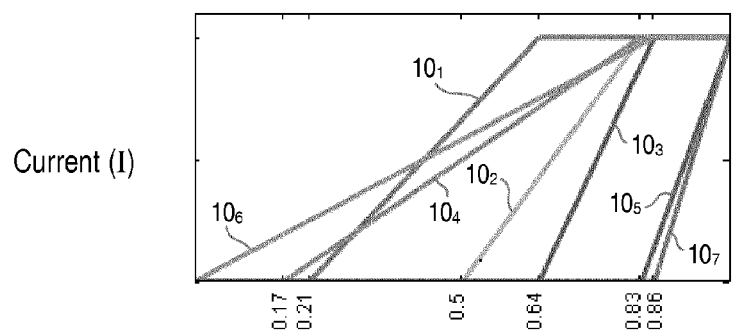
Figure 19A:
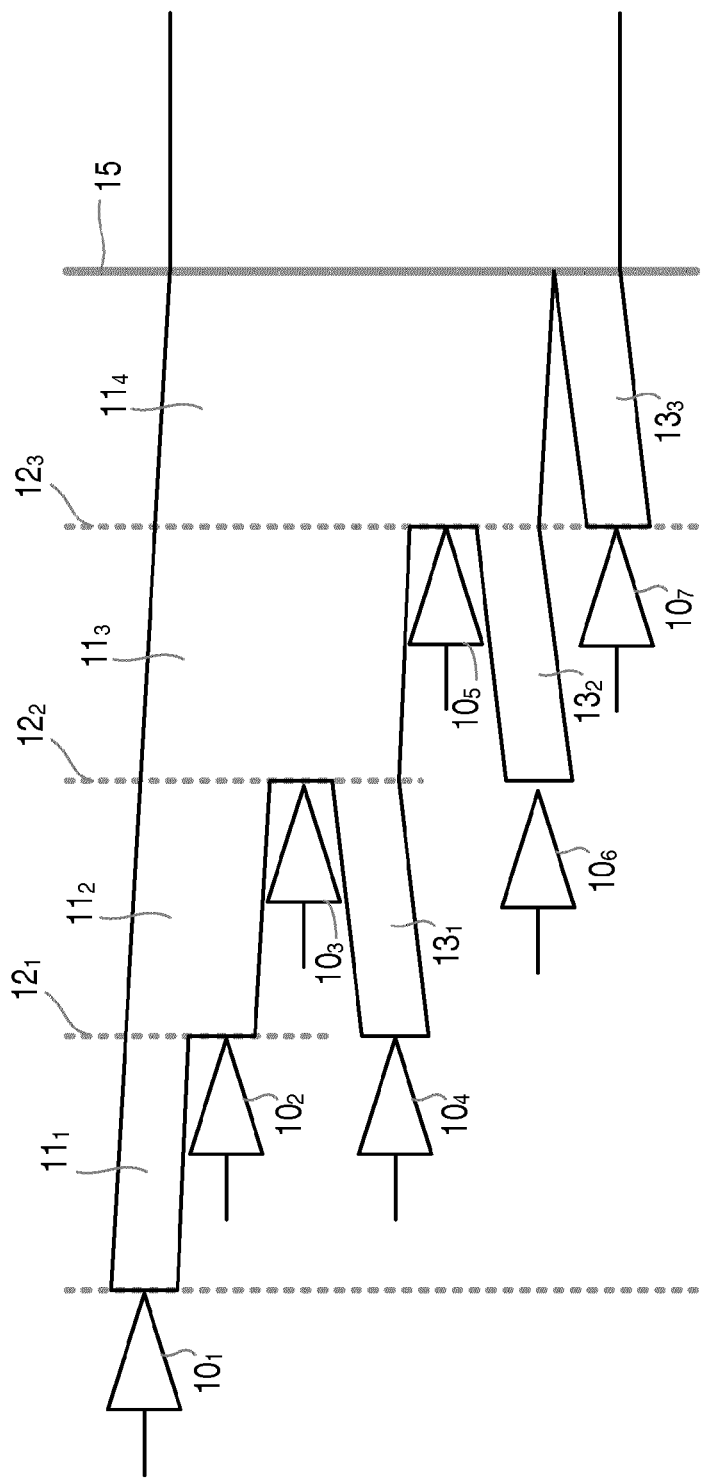
FIG. 19a shows an amplifier arrangement according to another embodiment of the present invention.

The examples of 7-stage amplifiers shown in the embodiments of FIGS. 18a and 19a have two consecutive junctions with both directly and quarterwave connected amplifiers. For example, in the embodiments of FIGS. 18a and 19a, the junction $12_2$ has an amplifier $10_3$ of the third stage coupled directly, and an amplifier $10_4$ of the fourth stage coupled via a connecting quarter wavelength transmission line $13_1$, while the consecutive junction $12_3$ has an amplifier $10_5$ of the fifth stage coupled directly, and an amplifier $10_6$ of the sixth stage coupled via a connecting quarter wavelength transmission line $13_2$.

The arrangement of FIGS. 18a and 19a differ in that FIG. 18a has the final amplifier, i.e. the amplifier $10_7$ of the seventh stage coupled directly to the output 15, while FIG. 19a has the final amplifier coupled via a quarter wavelength transmission line $13_3$ to the output 15.

FIG. 14b shows a plot of current against output amplitude for the seven-stage embodiment of the present invention as shown in FIG. 14a. The order of the amplifier starting points in this example is amplifier $10_4$ starting at zero, amplifier $10_1$ starting at 0.21 of full output amplitude, amplifier $10_2$ starting at 0.34 of full output amplitude, amplifier $10_3$ starting at 0.62 of full output amplitude, amplifier $10_5$ starting at 0.69 of full output amplitude, amplifier $10_5$ starting at 0.83 of full output amplitude, and amplifier $10_7$ starting at 0.86 of full output amplitude.

FIG. 14c shows a plot of voltage against output amplitude for the seven-stage embodiment of the present invention as shown in FIG. 14a.

FIG. 14d shows a plot of efficiency against output amplitude for the seven-stage embodiment of the present invention as shown in FIG. 14a.

Figure 15B:
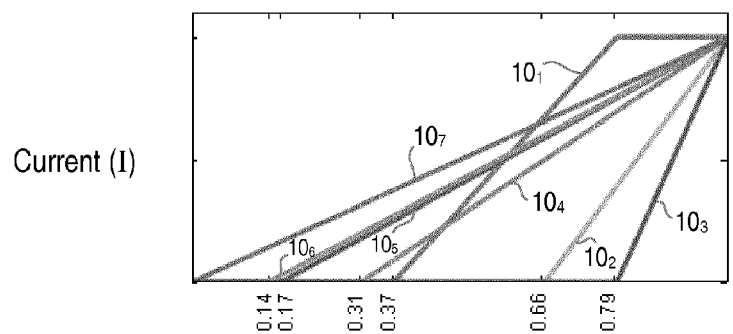

FIG. 15b shows a plot of current against output amplitude for the seven-stage embodiment of the present invention as shown in FIG. 15a. The order of the amplifier starting points in this example is amplifier $10_7$ starting at zero, amplifier $10_6$ starting at 0.14 of full output amplitude, amplifier $10_5$ starting at 0.17 of full output amplitude, amplifier $10_4$ starting at 0.31 of full output amplitude, amplifier $10_1$ starting at 0.37 of full output amplitude, amplifier $10_2$ starting at 0.66 of full output amplitude, and amplifier $10_3$ starting at 0.79 of full output amplitude.

Figure 15C:
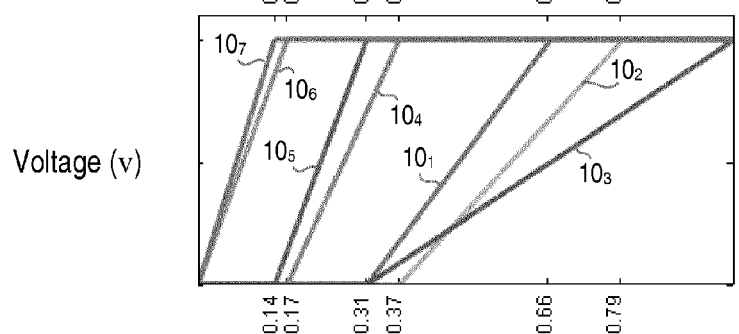

FIG. 15c shows a plot of voltage against output amplitude for the seven-stage embodiment of the present invention as shown in FIG. 15a.

Figure 15D:
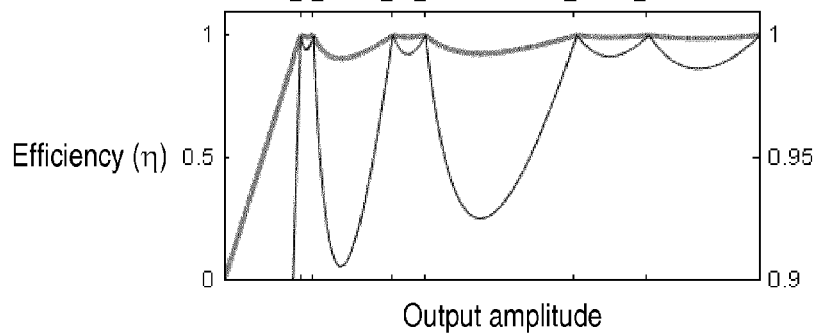

FIG. 15d shows a plot of efficiency against output amplitude for the seven-stage embodiment of the present invention as shown in FIG. 15a.

FIG. 16b shows a plot of current against output amplitude for the seven-stage embodiment of the present invention as shown in FIG. 16a. The order of the amplifier starting points in this example is amplifier $10_6$ starting at zero, amplifier $10_5$ starting at 0.17 of full output amplitude, amplifier $10_4$ also starting at 0.17 of full output amplitude, amplifier $10_1$ starting at 0.37 of full output amplitude, amplifier $10_2$ starting at 0.51 of full output amplitude, amplifier $10_3$ starting at 0.79 of full output amplitude, and amplifier $10_7$ starting at 0.86 of full output amplitude.

FIG. 16c shows a plot of voltage against output amplitude for the seven-stage embodiment of the present invention as shown in FIG. 16a.

FIG. 16d shows a plot of efficiency against output amplitude for the seven-stage embodiment of the present invention as shown in FIG. 16a.

Figure 17B:
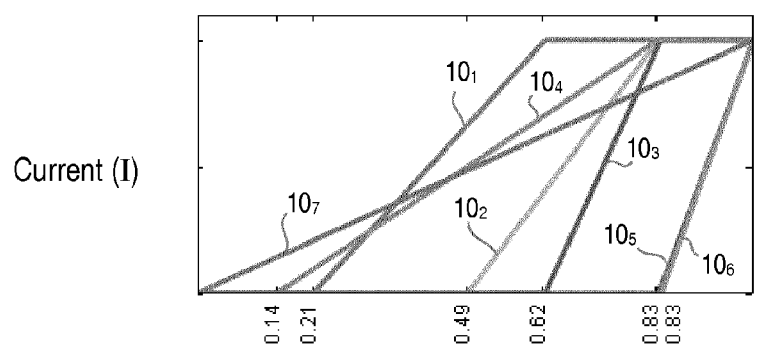

FIG. 17b shows a plot of current against output amplitude for the seven-stage embodiment of the present invention as shown in FIG. 17a. The order of the amplifier starting points in this example is amplifier $10_7$ starting at zero, amplifier $10_4$ starting at 0.14 of full output amplitude, amplifier $10_1$ starting at 0.21 of full output amplitude, amplifier $10_2$ starting at 0.49 of full output amplitude, amplifier $10_3$ starting at 0.62 of full output amplitude, amplifier $10_5$ starting at 0.83 of full output amplitude, and amplifier $10_6$ starting at 0.86 of full output amplitude.

Figure 17C:
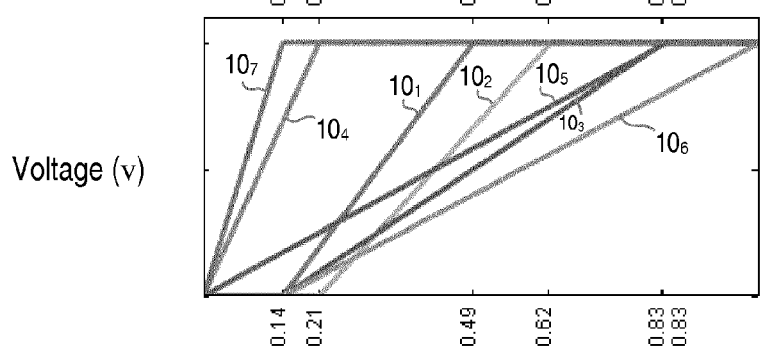

FIG. 17c shows a plot of voltage against output amplitude for the seven-stage embodiment of the present invention as shown in FIG. 17a.

Figure 17D:
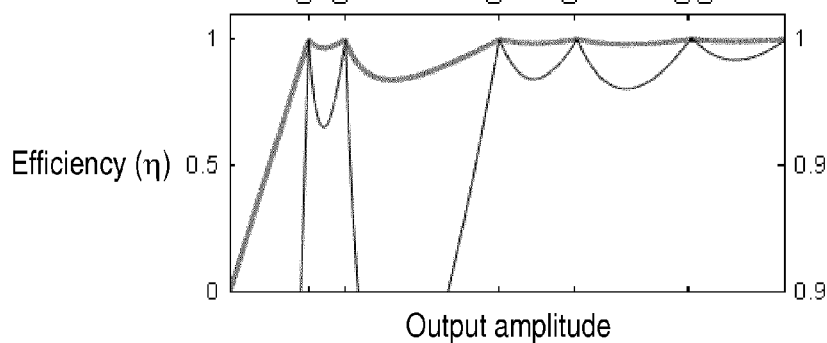

FIG. 17d shows a plot of efficiency against output amplitude for the seven-stage embodiment of the present invention as shown in FIG. 17a.

FIG. 18b shows a plot of current against output amplitude for the seven-stage embodiment of the present invention as shown in FIG. 18a. The order of the amplifier starting points in this example is amplifier $10_6$ starting at zero, amplifier $10_4$ starting at 0.17 of full output amplitude, amplifier $10_1$ starting at 0.21 of full output amplitude, amplifier $10_2$ starting at 0.5 of full output amplitude, amplifier $10_3$ starting at 0.64 of full output amplitude, amplifier $10_5$ starting at 0.83 of full output amplitude, and amplifier $10_7$ starting at 0.86 of full output amplitude.

Figure 18C:
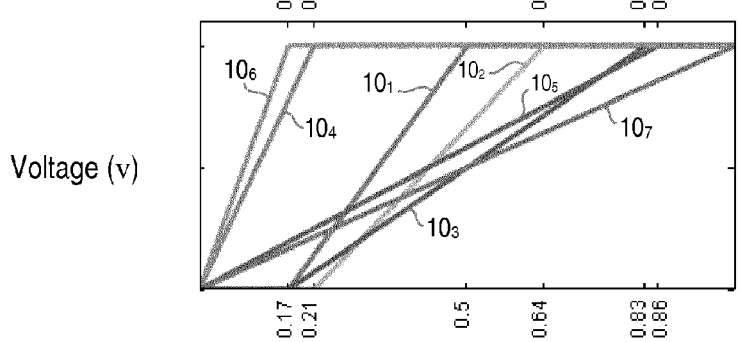

FIG. 18c shows a plot of voltage against output amplitude for the seven-stage embodiment of the present invention as shown in FIG. 18a.

Figure 18D:
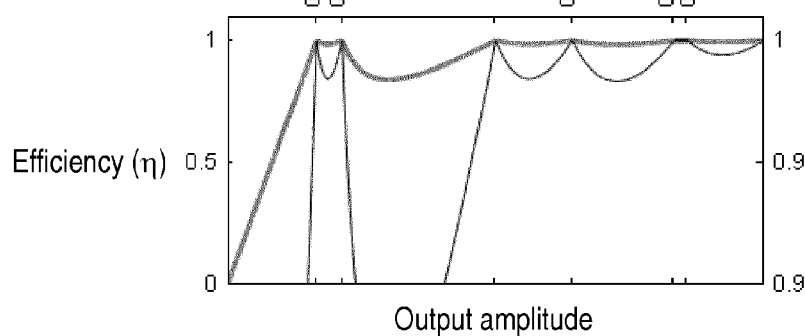

FIG. 18d shows a plot of efficiency against output amplitude for the seven-stage embodiment of the present invention as shown in FIG. 18a.

Figure 19B:
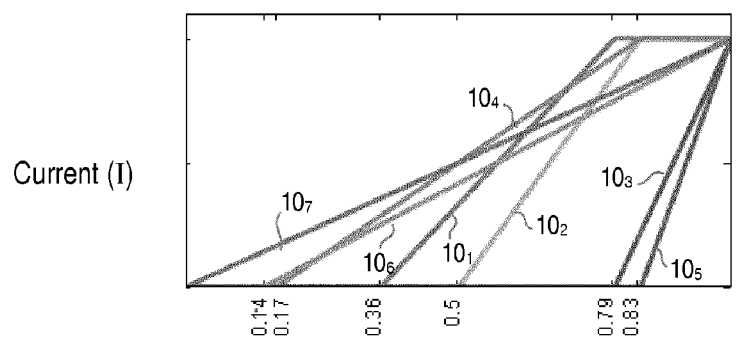

FIG. 19b shows a plot of current against output amplitude for the seven-stage embodiment of the present invention as shown in FIG. 19a. The order of the amplifier starting points in this example is amplifier $10_7$ starting at zero, amplifier $10_6$ starting at 0.14 of full output amplitude, amplifier $10_4$ starting at 0.17 of full output amplitude, amplifier $10_1$ starting at 0.36 of full output amplitude, amplifier $10_2$ starting at 0.5 of full output amplitude, amplifier $10_3$ starting at 0.79 of full output amplitude, and amplifier $10_5$ starting at 0.83 of full output amplitude.

Figure 19C:
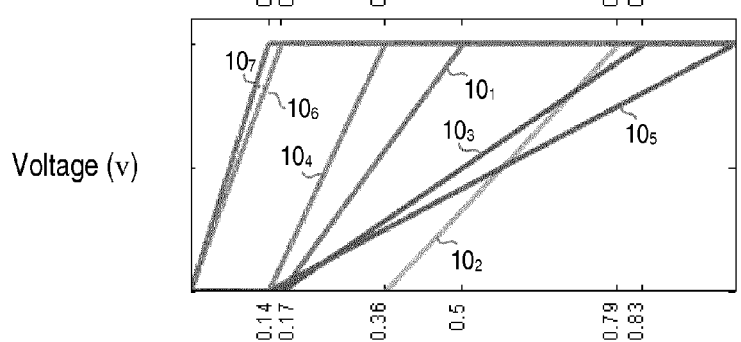

FIG. 19c shows a plot of voltage against output amplitude for the seven-stage embodiment of the present invention as shown in FIG. 19a.

Figure 19D:
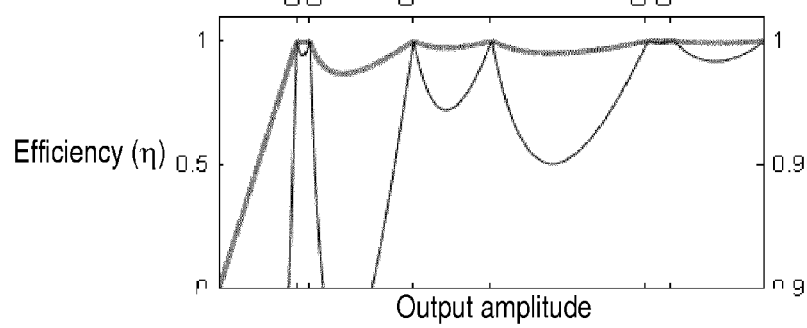

FIG. 19d shows a plot of efficiency against output amplitude for the seven-stage embodiment of the present invention as shown in FIG. 19a.

It is noted that having two consecutive junctions with both directly and quarterwave connected amplifiers, as shown in the embodiments of FIGS. 18a and 19a, can be repetitively extended to higher orders. The first 6-stage, 8-stage, etc., amplifier structure can also form part of an amplifier network extended on the output side as in the previous examples, i.e. used as a substitute for the 4-stage or 6-stage structures of the previous examples. For this type of regular repeated structure the starting order (starting point of delivering RF current from lowest amplitude to highest) of the amplifiers can be generalized as follows. First the quarter-wave-connected amplifiers start in the order of closest to farthest from the output 15. Then, the directly connected amplifiers follow in the reverse order, i.e. the one farthest from the output first.

Thus, in FIGS. 18a and 19a, the amplifier comprises seven amplifier stages $10_1$ to $10_7$, and the cascade comprises N-3 quarter wavelength transmission line segments $11_1$ to $11_4$. The arrangement further comprises a second intermediate junction $12_3$ in the cascade of quarter wavelength transmission line segments, the second intermediate junction $12_3$ being consecutive to the first intermediate junction $12_2$, the second intermediate junction comprising an amplifier $10_5$ of the fifth stage coupled directly thereto, and an amplifier $10_6$ of the sixth stage coupled thereto via a connecting quarter wavelength transmission line $13_2$. Furthermore, an amplifier $10_7$ of the seventh stage can be either coupled directly to the output node 15, or coupled to the output node 15 via a connecting quarter wavelength transmission line $13_3$.

Some of the efficiency curves of the examples above with all-equal-sized sub-amplifiers are acceptable, although the prevailing close grouping of two consecutive efficiency peaks means that a higher order amplifier is needed to perform the same task as could be done with a more properly dimensioned lower order one. An optimal distribution can always be achieved by allowing any combination of maximum output powers. This is nearly achievable for example in some microwave monolithic integrated circuit (MMIC) implementations, wherein the smallest transistor size difference is determined by the output power of a unity cell of which usually a large number are combined to make a full transistor.

In the embodiments above, each of the amplifiers in the N amplifier stages ($10_1$ to $10_N$) is of a substantially equal size. By substantially equal size is meant that the amplifiers have substantially the same maximum output power.

Furthermore, in the examples described above, a characteristic impedance of each successive segment in the cascade of quarter wavelength transmission line segments $11_1$ to $11_M$ is reduced towards the output node in relation to the parallel combination of preceding transmission lines, whereby the characteristic impedance of each successive segment is reduced to 1/M of the impedance of the transmission line from a single amplifier, whereby M relates to the number of preceding amplifiers. This applies to each segment apart from a segment which has two amplifiers connected thereto. The ratio 1/M applies if all sub-amplifiers are connected by the same impedance (have the same size, optimally).

In the examples described above, the characteristic impedance of each of the connecting quarter wavelength transmission lines 13 is substantially equal.

When designing with prefabricated transistors, only a small selection of transistor sizes is generally available (either packaged from the manufacturer or by paralleling by the designer). In the following examples, amplifier arrangements are provided according to embodiments of the present invention, using a selection of only two different, small integer related, amplifier sizes.

Figure 20A:
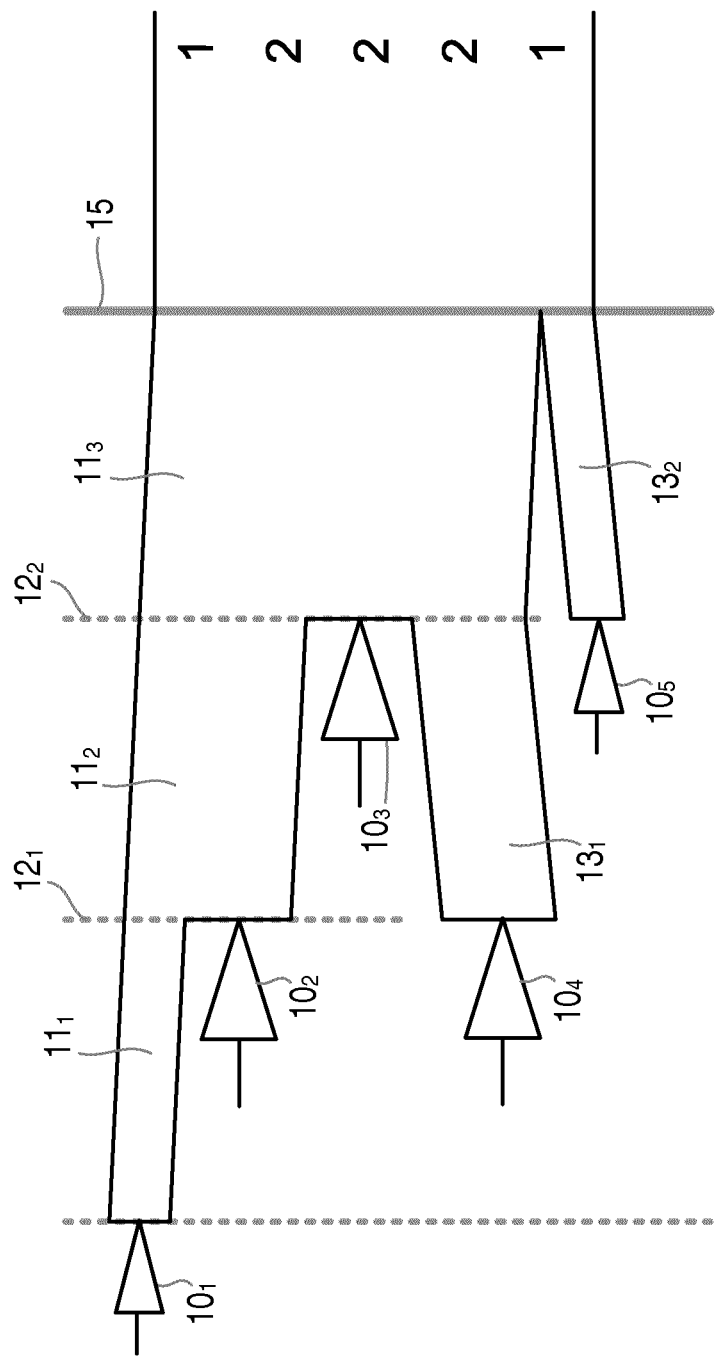
FIG. 20a shows an amplifier arrangement according to another embodiment of the present invention.
Figure 21A:
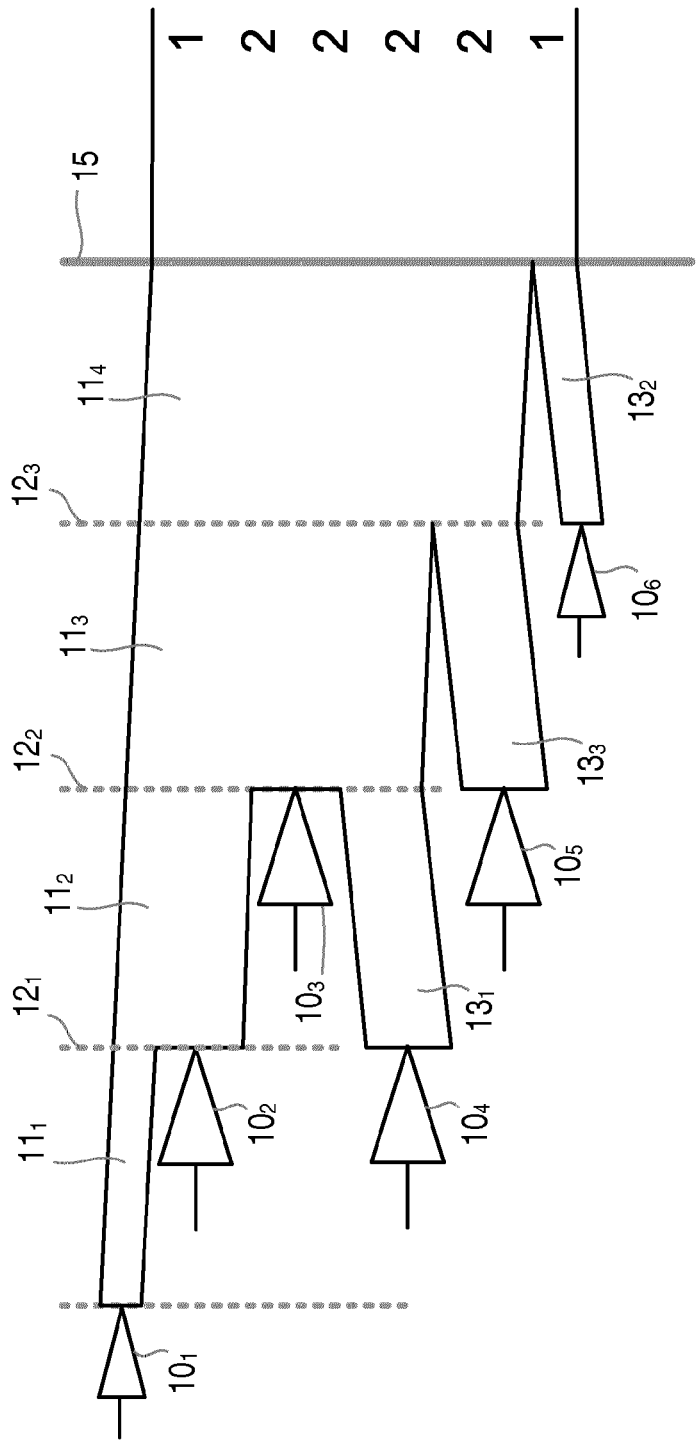
FIG. 21a shows an amplifier arrangement according to another embodiment of the present invention.

The embodiments of FIGS. 20a and 21a are examples of a five-stage and a six-stage amplifier structure, respectively. They are both dimensioned so that the amplifiers closest and farthest from the output (top and bottom), both connected by quarter wavelength lines, have half the size, and consequentially twice the characteristic impedance in their connecting lines, than that of the other amplifiers. The amplifier closest to the output is the starting amplifier in both cases.

Figure 20B:
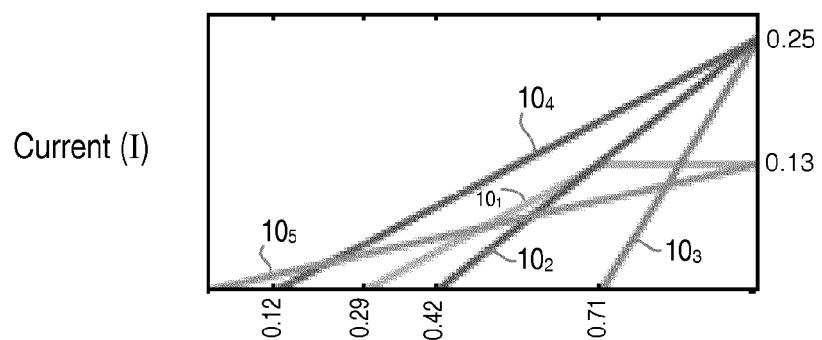

FIG. 20b shows a plot of current against output amplitude for the five-stage embodiment of the present invention as shown in FIG. 20a. The order of the amplifier starting points in this example is amplifier $10_5$ starting at zero, amplifier $10_4$ starting at 0.12 of full output amplitude, amplifier $10_1$ starting at 0.29 of full output amplitude, amplifier $10_2$ starting at 0.42 of full output amplitude, and amplifier $10_3$ starting at 0.71 of full output amplitude.

Figure 20C:
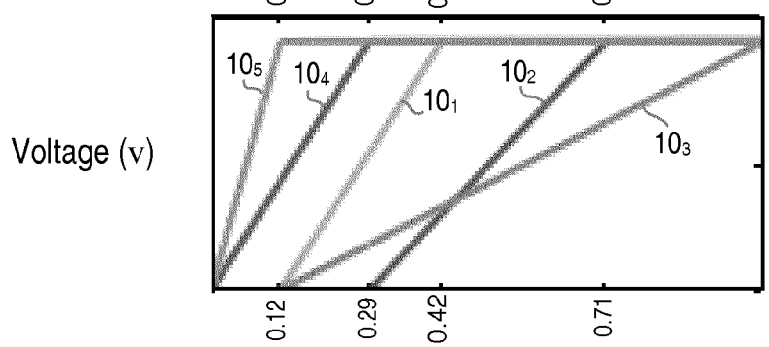

FIG. 20c shows a plot of voltage against output amplitude for the seven-stage embodiment of the present invention as shown in FIG. 20a.

Figure 20D:
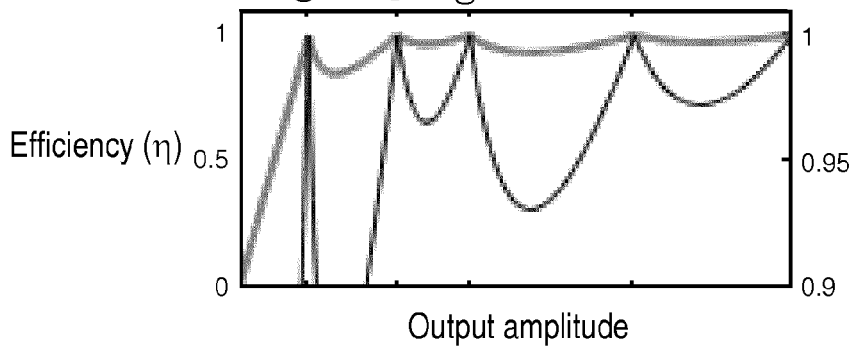

FIG. 20d shows a plot of efficiency against output amplitude for the seven-stage embodiment of the present invention as shown in FIG. 20a.

Figures 21B, 21C, 21D:
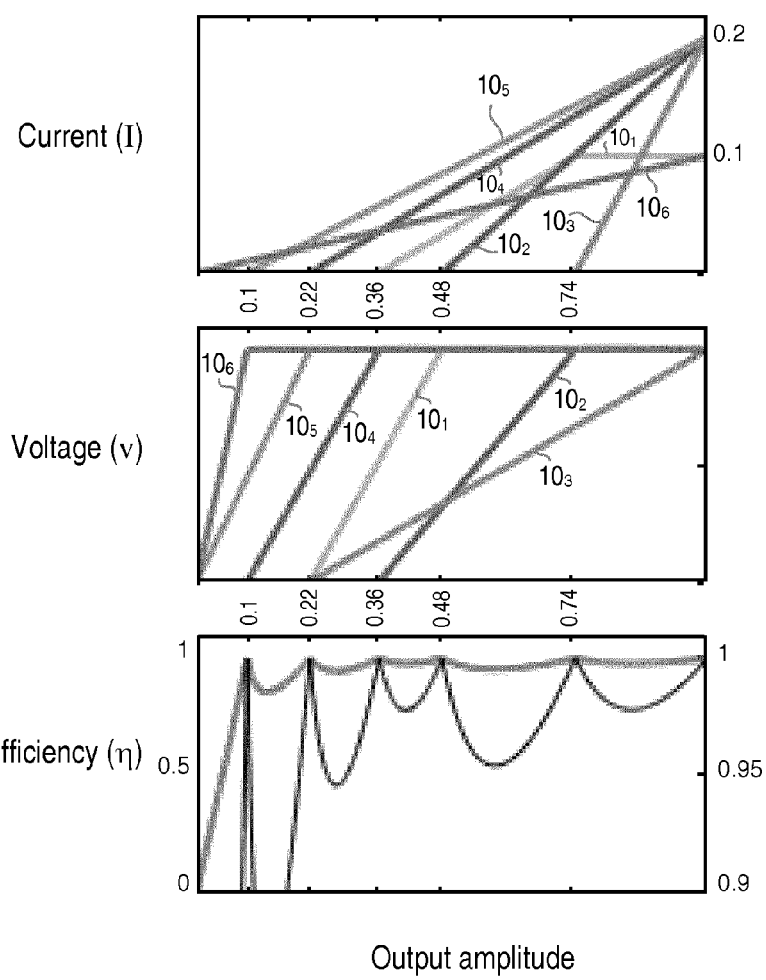

FIG. 21b shows a plot of current against output amplitude for the six-stage embodiment of the present invention as shown in FIG. 21a. The order of the amplifier starting points in this example is amplifier $10_6$ starting at zero, amplifier $10_5$ starting at 0.1 of full output amplitude, amplifier $10_4$ starting at 0.22 of full output amplitude, amplifier $10_1$ starting at 0.36 of full output amplitude, amplifier $10_2$ starting at 0.48 of full output amplitude, and amplifier $10_3$ starting at 0.74.

FIG. 21c shows a plot of voltage against output amplitude for the seven-stage embodiment of the present invention as shown in FIG. 21a.

FIG. 21d shows a plot of efficiency against output amplitude for the seven-stage embodiment of the present invention as shown in FIG. 21a.

Thus, according to another embodiment of the invention, one or more of the examples described above may be adapted such that at least one amplifier is reduced in size compared to the other amplifiers in the other amplifier stages, and wherein the characteristic impedance of a corresponding quarter wavelength transmission line and/or connecting quarter wavelength transmission line is increased by a corresponding ratio compared to the characteristic impedance of each of the other quarter wavelength transmission lines and/or connecting quarter wavelength transmission lines.

We see from the distribution of efficiency peaks in relation to the embodiments of FIGS. 20a and 21a that the distribution is improved compared to some of the other examples, for example by being more even than in the previous all-equal-size examples.

Figure 22A:
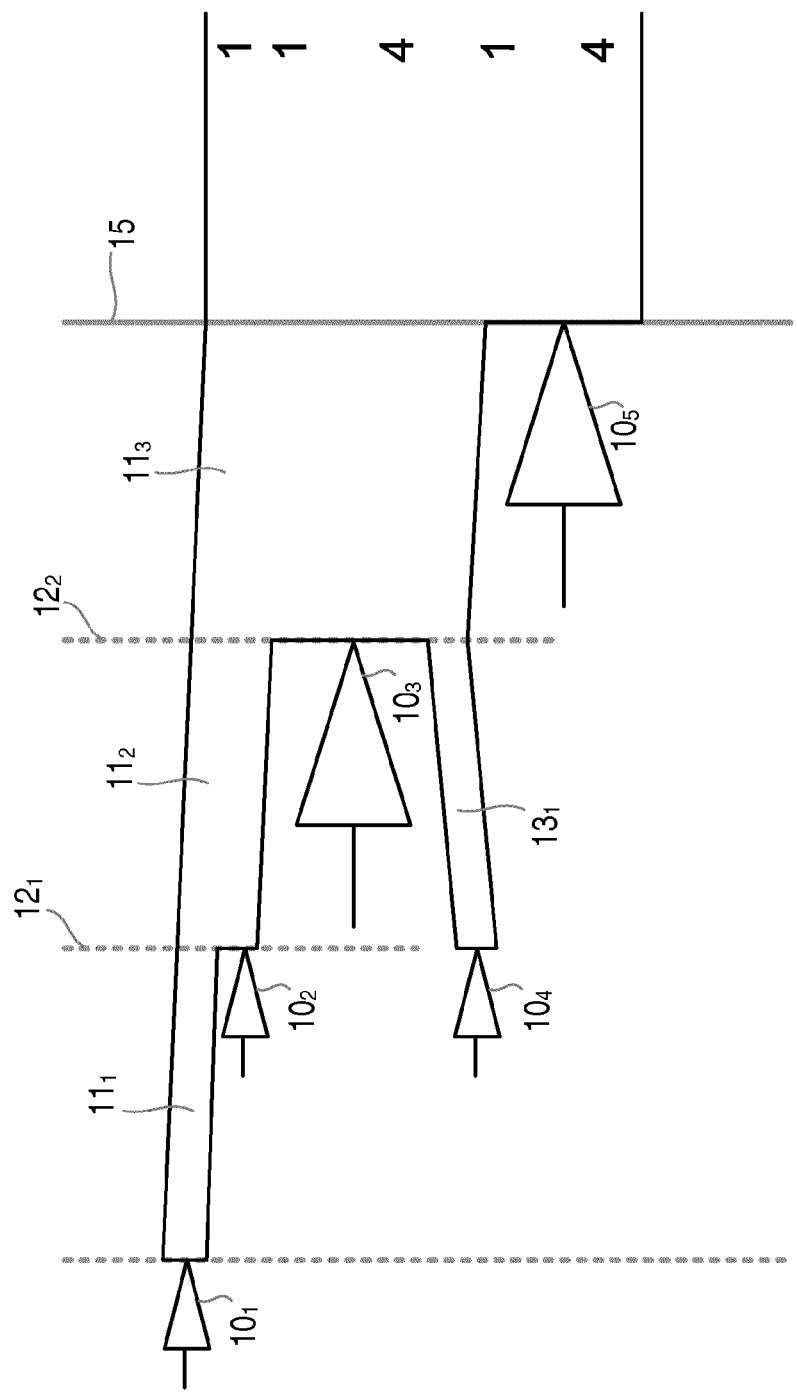
FIG. 22a shows an amplifier arrangement according to another embodiment of the present invention.
Figure 23A:
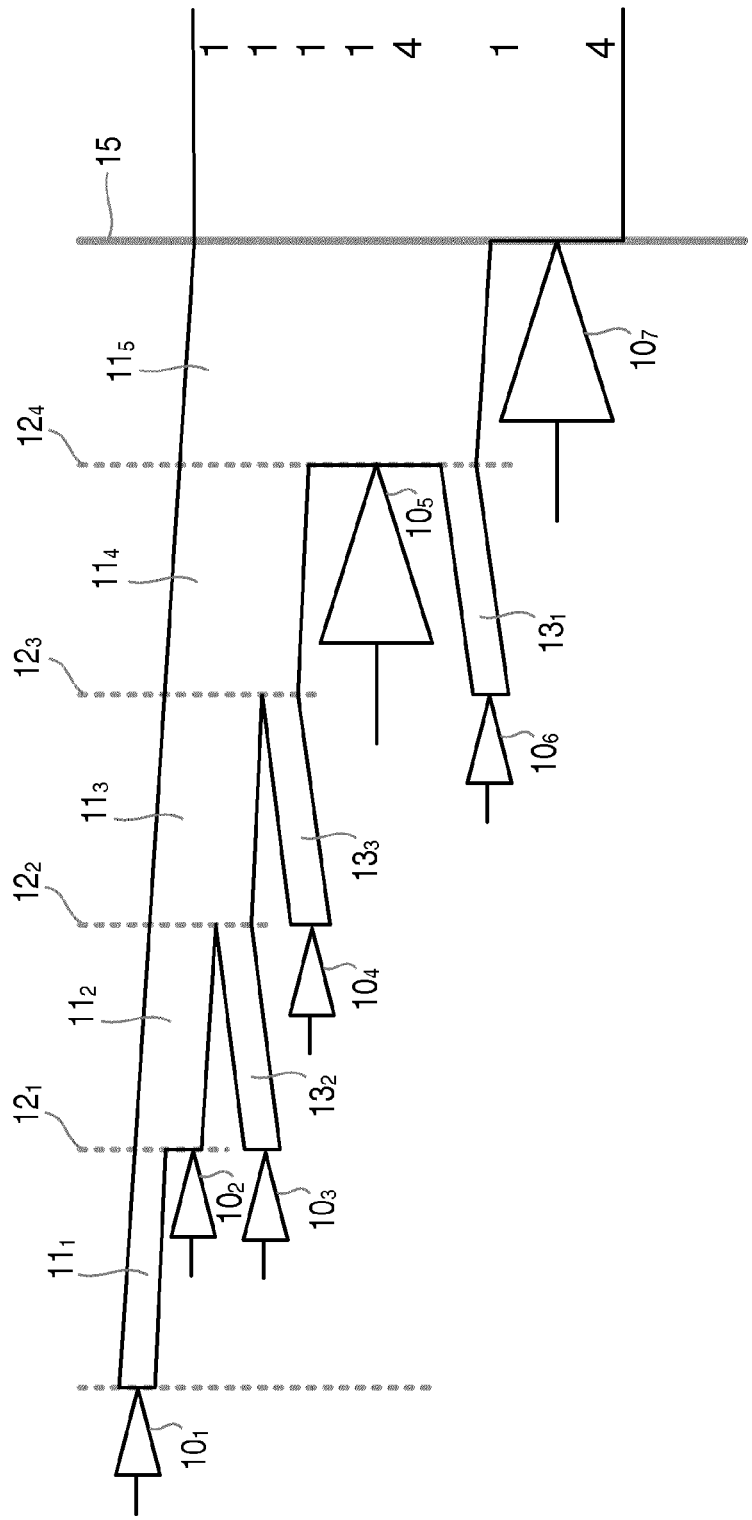
FIG. 23a shows an amplifier arrangement according to another embodiment of the present invention.

If transistor sizes are available in a 4-to-1 relation they can be used, for example, in the five-stage and seven-stage examples of FIGS. 22a and 23a, respectively, whereby the two last peaking amplifiers are four times as big as the other three or five sub-amplifiers.

In the example of FIG. 22a the amplifiers $10_3$ and $10_5$ are four times as large as the amplifiers $10_1$, $10_2$ and $10_4$.

Figure 22B:
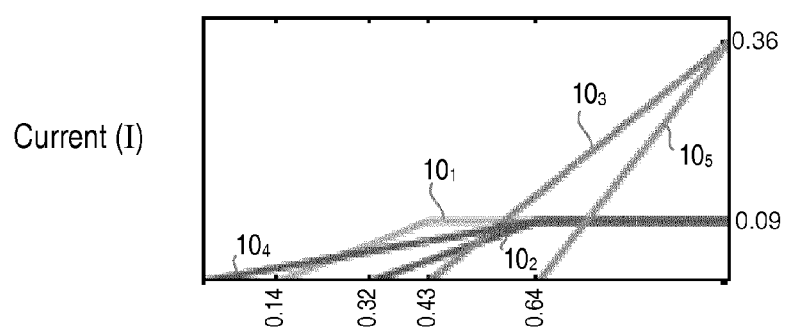

FIG. 22b shows a plot of current against output amplitude for the five-stage embodiment of the present invention as shown in FIG. 22a. The order of the amplifier starting points in this example is amplifier $10_4$ starting at zero, amplifier $10_1$ starting at 0.14 of full output amplitude, amplifier $10_2$ starting at 0.32 of full output amplitude, amplifier $10_3$ starting at 0.43 of full output amplitude, and amplifier $10_5$ starting at 0.64 of full output amplitude.

Figure 22C:
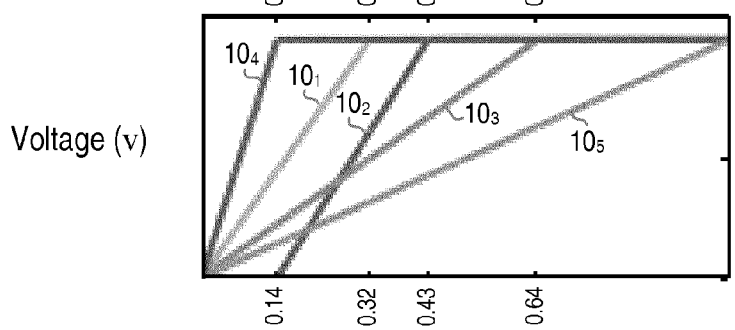

FIG. 22c shows a plot of voltage against output amplitude for the seven-stage embodiment of the present invention as shown in FIG. 22a.

Figure 22D:
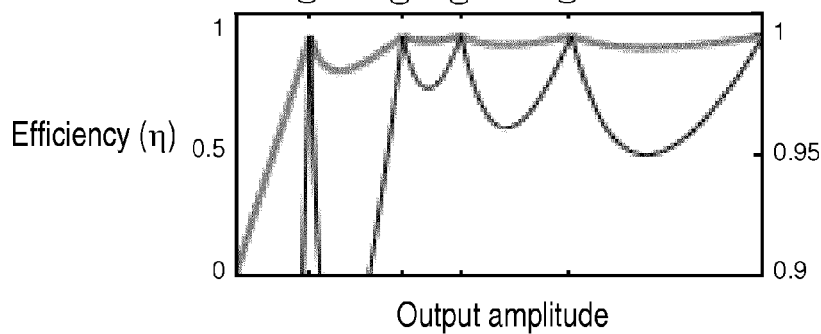

FIG. 22d shows a plot of efficiency against output amplitude for the seven-stage embodiment of the present invention as shown in FIG. 22a.

In the example of FIG. 23a the amplifiers $10_5$ and $10_7$ are four times as large as the amplifiers $10_1$, $10_2$, $10_3$, $10_4$ and $10_6$.

Figure 23B:
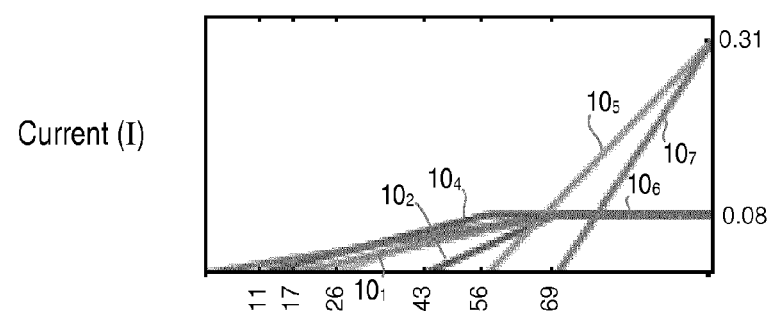

FIG. 23b shows a plot of current against output amplitude for the five-stage embodiment of the present invention as shown in FIG. 23a. The order of the amplifier starting points in this example is amplifier $10_6$ starting at zero, amplifier $10_4$ starting at 0.11 of full output amplitude, amplifier $10_3$ starting at 0.17 of full output amplitude, amplifier $10_1$ starting at 0.26 of full output amplitude, amplifier $10_2$ starting at 0.43 of full output amplitude, amplifier $10_5$ starting at 0.56 of full output amplitude, and amplifier $10_7$ starting at 0.69 of full output amplitude.

Figure 23C:
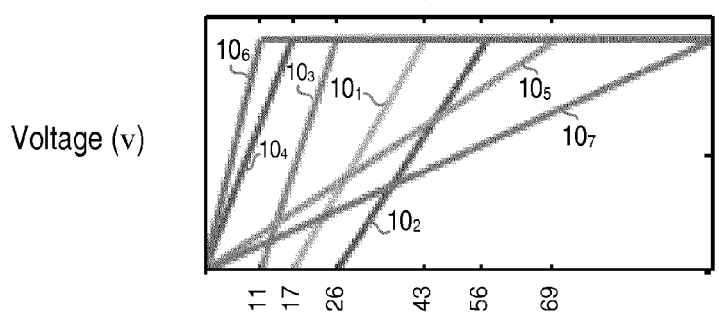

FIG. 23c shows a plot of voltage against output amplitude for the seven-stage embodiment of the present invention as shown in FIG. 23a.

Figure 23D:
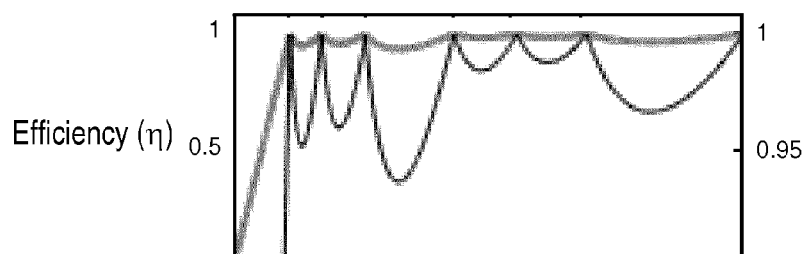

FIG. 23d shows a plot of efficiency against output amplitude for the seven-stage embodiment of the present invention as shown in FIG. 23a.

The efficiency peak distributions are in both these cases very good for medium to high PAR signal amplitude distributions.

The amplifiers according to embodiments of the invention described herein may follow the same general rules as other multistage Doherty amplifiers when it comes to drive signals. Essentially, with increasing amplitude, a new amplifier needs to start delivering current only when a previous amplifier has reached its maximum voltage (saturation). As with other Doherty amplifiers, the RF output voltages and currents at an amplifier stage are always in phase in the ideal implementation (and at center frequency). The relative phases of the drive signals to the amplifiers are easily found by inspection of the electrical length from each amplifier to the common output (i.e. time delay over the lengths of transmission line).

It is noted that any quarterwave transmission line in the Doherty amplifiers described above can double as an impedance transformer, i.e. the impedance and corresponding maximum RF voltage swings can be individually adjusted for each transistor. This can be useful if one or more of the amplifiers/transistors are made with a different technology having different voltage rating. It can also be beneficial to use these transformations to accommodate different load impedances, instead of making this transformation outside of the Doherty amplifier which would require extra impedance transformers. Apart from these considerations, it is usually best to have as little extra impedance transformations as possible in the Doherty network, since this generally gives high bandwidth and low sensitivity.

Transistors in general act as controlled RF current sources, so the shape of the amplitudes and phases (relative to that of the output) of the RF currents as functions of the output amplitude also suggest the shaping that must be performed to the input signals to the transistors, i.e. the gate drive voltages. The actual shapes may, according to some examples, be adapted to take into account that the voltage-to-current conversion (transconductance) in the transistors is more or less nonlinear, and that the RF voltage swing can influence the output current as well (especially via saturation when close to the upper limit). Causing a transistor to "turn on" and start delivering RF current at higher amplitude is often done by lowering the gate bias to the transistor, i.e. operating in some degree of class C. Less large-scale amplitude shaping then needs to be done earlier in the processing chain, albeit often at the cost of lower gain and lower maximum output power.

It is noted that any or all of the transmission lines in the examples described herein can be wholly or partially replaced by combinations of lumped elements. For example, the quarterwave lines can be replaced by LC pi- or T-networks with inductors (L) and capacitors (C) with reactance equal in magnitude to the characteristic impedance of the replaced quarterwave line.

The embodiments described herein provide amplifier arrangements that have different current, voltage and efficiency curve behaviors compared to prior art systems. Some of these amplifiers achieve very good efficiency peak distributions for medium to high PAR signals with transistor sizes in a 2-to-1 relationship. If only transistor sizes in a 4-to-1 relationship are available, the described 5-stage amplifier of the embodiment of FIG. 21a provides an improved performance, and some of these amplifiers also provide improved performance for other numbers of stages. The examples described herein therefore expand the dimensioning possibilities in new and useful ways.

Figure 24:
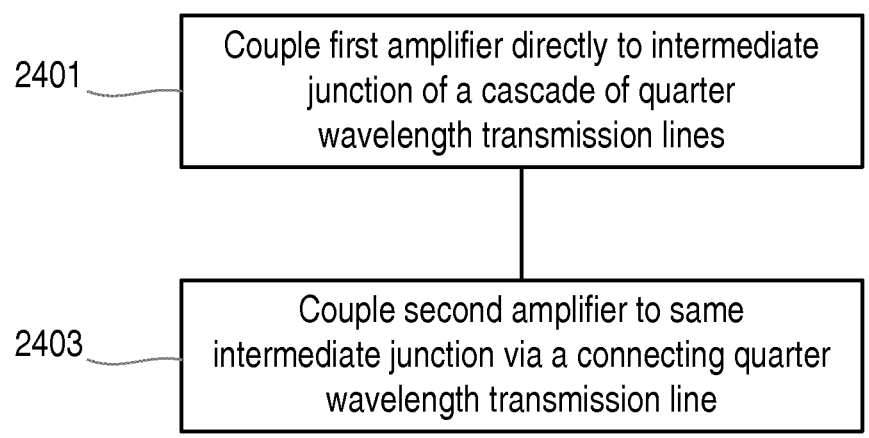
FIG. 24 shows a method according to an embodiment of the invention.

FIG. 24 shows the steps performed by an embodiment, according to another aspect of the present invention, for improving the efficiency of an amplifier arrangement comprising N amplifier stages $10_1$ to $10_N$, wherein N is an integer equal or greater than five; wherein the amplifier arrangement comprises a cascade of quarter wavelength transmission line segments coupled between an output of an amplifier of a first amplifier stage $10_1$ and an output node 15 of the amplifier arrangement. The method comprises the steps of coupling a first amplifier directly to an intermediate junction 12 of the cascade of quarter wavelength transmission lines, step 2401, and coupling a second amplifier to the same intermediate junction via a connecting quarter wavelength transmission line $13_1$, step 2403.

It is noted that although the embodiments described above refer to the directly coupled amplifier always preceding the quarter-wavelength-connected amplifier, these amplifiers can be connected vice versa without affecting the electrical behavior of the amplifier arrangement (in which case references to an Nth stage are also transposed). All nodes are assumed to have very small bandwidth compared to a quarter wavelength. It is noted that the width of the lines are exaggerated in the drawings. Another option is to connect amplifiers on opposite sides of a central quarterwave cascade.

It is also noted that references herein to a "directly" coupled amplifier may be replaced by an amplifier connected by a half wavelength line (or whole, etc) or equivalent circuit thereof. It is also noted that references to "quarter wavelength transmission lines" may use any odd number of quarter wavelengths. Thus, a general rule for both of these situations is that it is possible to insert a half wavelength into the circuit and achieve the same behaviour (except an inversion of the drive signal; 180 degree phase shift) at center frequency.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single processor or other unit may fulfil the functions of several units recited in the claims. Any reference signs in the claims shall not be construed so as to limit their scope.

The invention claimed is:

1. A Doherty amplifier arrangement comprising N amplifier stages configured to operate as a multi-stage Doherty amplifier, wherein N is an integer equal to or greater than five; the Doherty amplifier arrangement comprising:
   a cascade of quarter wavelength transmission line segments coupled between an output of an amplifier of a first amplifier stage of the N amplifier stages and an output node of the Doherty amplifier arrangement;
   wherein at least one intermediate junction in the cascade of quarter wavelength transmission line segments comprises:
   a first amplifier coupled directly to the intermediate junction; and
   a second amplifier coupled to the same intermediate junction via a connecting quarter wavelength transmission line.

2. The Doherty amplifier arrangement of claim 1 wherein:
   the first amplifier comprises an amplifier of the third stage of the N amplifier stages; and
   the second amplifier comprises an amplifier of the fourth stage of the N amplifier stages.

3. The Doherty amplifier arrangement of claim 2, wherein the Doherty amplifier arrangement comprises five amplifier stages configured to operate as a Doherty amplifier, and the cascade comprises N-2 quarter wavelength transmission line segments, and wherein an amplifier of the fifth stage of the five amplifier stages is either:
   coupled directly to the output node; or
   coupled to the output node via a connecting quarter wavelength transmission line.

4. The Doherty amplifier arrangement of claim 2, wherein the Doherty amplifier arrangement comprises six amplifier stages configured to operate as a Doherty amplifier, and the cascade comprises N-2 quarter wavelength transmission line segments, and wherein:
   an amplifier of the fifth stage of the six amplifier stages is directly coupled to a respective junction of the cascade of quarter wavelength transmission line segments, and an amplifier of the sixth stage of the six amplifier stages is coupled directly to the output node; or
   an amplifier of the fifth stage of the six amplifier stages is coupled to a respective junction of the cascade of quarter wavelength transmission line segments via a connecting quarter wavelength transmission line, and an amplifier of the sixth stage of the six amplifier stages is coupled to the output node via a connecting quarter wavelength transmission line.

5. The Doherty amplifier arrangement of claim 2, wherein the Doherty amplifier arrangement comprises six amplifier stages configured to operate as a Doherty amplifier, and the cascade comprises N-3 quarter wavelength transmission line segments, and wherein:
   an amplifier of the fifth stage of the six amplifier stages is coupled directly to the output node, and an amplifier of the sixth stage of the six amplifier stages is coupled to the output node via a connecting quarter wavelength transmission line.

6. The Doherty amplifier arrangement of claim 1, wherein the Doherty amplifier arrangement comprises seven amplifier stages configured to operate as a Doherty amplifier, and wherein:
   the first amplifier comprises an amplifier of the fifth stage of the six amplifier stages; and
   the second amplifier comprises an amplifier of the sixth stage of the six amplifier stages.

7. The Doherty amplifier arrangement of claim 6, wherein the cascade comprises N-2 quarter wavelength transmission line segments, and wherein an amplifier of the seventh stage of the seven amplifier stages is either:
   coupled directly to the output node; or
   coupled to the output node via a connecting quarter wavelength transmission line.

8. The Doherty amplifier arrangement of claim 6 wherein:
   an amplifier of the third stage of the seven amplifier stages and an amplifier of the fourth stage of the seven amplifier stages are directly coupled to respective junctions of the cascade of quarter wavelength transmission line segments; or
   an amplifier of the third stage of the seven amplifier stages and an amplifier of the fourth stage of the seven amplifier stages are coupled to respective junctions of the cascade of quarter wavelength transmission line segments via respective connecting quarter wavelength transmission lines.

9. The Doherty amplifier arrangement of claim 1, wherein the Doherty amplifier arrangement comprises seven amplifier stages configured to operate as a Doherty amplifier, and the cascade comprises N-2 quarter wavelength transmission line segments and wherein:
the first amplifier comprises an amplifier of the third stage of the seven amplifier stages; and
the second amplifier comprises an amplifier of the fourth stage of the seven amplifier stages.

10. The Doherty amplifier arrangement of claim 9, wherein an amplifier of the seventh stage of the seven amplifier stages is either:
coupled directly to the output node; or
coupled to the output node via a connecting quarter wavelength transmission line.

11. The Doherty amplifier arrangement of claim 9 wherein:
an amplifier of the fifth stage of the seven amplifier stages and an amplifier of the sixth stage of the seven amplifier stages are directly coupled to respective junctions of the cascade of quarter wavelength transmission line segments; or
an amplifier of the fifth stage of the seven amplifier stages and an amplifier of the sixth stage of the seven amplifier stages are coupled to respective junctions of the cascade of quarter wavelength transmission line segments via respective connecting quarter wavelength transmission lines.

12. The Doherty amplifier arrangement of claim 2, wherein the Doherty amplifier arrangement comprises seven amplifier stages configured to operate as a Doherty amplifier, and the cascade comprises N-3 quarter wavelength transmission line segments, further comprising a second intermediate junction in the cascade of quarter wavelength transmission line segments, the second intermediate junction being consecutive to the first intermediate junction, the second intermediate junction comprising:
an amplifier of the fifth stage of the seven amplifier stages coupled directly thereto; and
an amplifier of the sixth stage of the seven amplifier stages coupled thereto via a connecting quarter wavelength transmission line.

13. The Doherty amplifier arrangement of claim 12, wherein an amplifier of the seventh stage of the seven amplifier stages is either:
coupled directly to the output node; or
coupled to the output node via a connecting quarter wavelength transmission line.

14. The Doherty amplifier arrangement of claim 1, wherein the at least one intermediate junction comprises:
a junction of the cascade of quarter wavelength transmission line segments that is the junction preceding the output node; or
a junction of the cascade of quarter wavelength transmission line segments that is the second junction of the cascade.

15. The Doherty amplifier arrangement of claim 1, further comprising a second intermediate junction, consecutive to the first intermediate junction, that comprises one amplifier coupled directly to the second intermediate junction, and another amplifier coupled to the second intermediate junction via a connecting quarter wavelength transmission line.

16. The Doherty amplifier arrangement of claim 1, wherein each of the amplifiers in the N amplifier stages of the Doherty amplifier arrangement is of a substantially equal size.

17. The Doherty amplifier arrangement of claim 1, wherein a characteristic impedance of each successive segment in the cascade of quarter wavelength transmission line segments is reduced towards the output node in relation to the parallel combination of preceding transmission lines, whereby the characteristic impedance of each successive segment is reduced to 1/M of the impedance of the transmission line from a single amplifier, whereby M relates to the number of preceding amplifiers.

18. The Doherty amplifier arrangement of claim 1, wherein the characteristic impedance of each of the connecting quarter wavelength transmission lines is substantially equal.

19. The Doherty amplifier arrangement of claim 1, wherein at least one amplifier is reduced in size compared to the other amplifiers in the other amplifier stages of the of the N amplifier stages, and wherein the characteristic impedance of a corresponding quarter wavelength transmission line and/or connecting quarter wavelength transmission line is increased by a corresponding ratio compared to the characteristic impedance of each of the other quarter wavelength transmission lines and/or connecting quarter wavelength transmission lines.

20. A method of improving the efficiency of a Doherty amplifier arrangement comprising N amplifier stages configured to operate as a multi-stage Doherty amplifier, wherein N is an integer equal or greater than five; wherein the Doherty amplifier arrangement comprises a cascade of quarter wavelength transmission line segments coupled between an output of an amplifier of a first amplifier stage of the N amplifier stages and an output node of the Doherty amplifier arrangement, the method comprising the steps of:
coupling a first amplifier directly to an intermediate junction of the cascade of quarter wavelength transmission lines; and
coupling a second amplifier to the same intermediate junction via a connecting quarter wavelength transmission line.

* * * * *

UNITED STATES PATENT AND TRADEMARK OFFICE
CERTIFICATE OF CORRECTION

PATENT NO. : 9,941,851 B2
APPLICATION NO. : 15/126653
DATED : April 10, 2018
INVENTOR(S) : Richard Hellberg It is certified that error appears in the above-identified patent and that said Letters Patent is hereby corrected as shown below:

In the Specification

In Column 1, Line 40, delete "waves,"," and insert -- waves", --, therefor.

In Column 6, Lines 1-2, delete "deceasing" and insert -- decreasing --, therefor.

In Column 9, Line 28, delete "seem" and insert -- seen --, therefor.

In Column 10, Line 29, delete "FIGS. 11 a" and insert -- FIG. 11a --, therefor.

In Column 12, Line 28, delete "amplifier $10_5$" and insert -- amplifier $10_6$ --, therefor.

In Column 14, Line 23, delete "unity cell" and insert -- unit cell --, therefor.

In Column 16, Line 37, delete "have as" and insert -- have a --, therefor.

Signed and Sealed this
Fifth Day of November, 2019

Andrei Iancu
*Director of the United States Patent and Trademark Office*